United States Patent [19]

Miki et al.

[11] Patent Number: 5,245,550

[45] Date of Patent: Sep. 14, 1993

[54] APPARATUS FOR WIRE ROUTING OF VLSI

[75] Inventors: Yoshio Miki; Kei Suzuki, both of Kokubunji, Japan; Yoshio Takamine, Albany, Calif.

[73] Assignee: Hitachi, Ltd., Tokyo, Japan

[21] Appl. No.: 820,995

[22] Filed: Jan. 15, 1992

[30] Foreign Application Priority Data

Jan. 25, 1991 [JP] Japan .................................. 3-007547

[51] Int. Cl.$^5$ ............................................. G06F 15/60
[52] U.S. Cl. ................................. 364/490; 364/489; 364/488
[58] Field of Search ............... 364/488, 489, 490, 491; 395/800

[56] References Cited

U.S. PATENT DOCUMENTS

| | | | |
|---|---|---|---|
| 3,617,714 | 11/1971 | Kernighan et al. ................ | 364/488 |
| 3,681,782 | 8/1972 | Scanlon ............................ | 364/491 |
| 4,484,292 | 6/1984 | Hong et al. ....................... | 395/800 |
| 4,495,559 | 1/1985 | Gelatt, Jr. et al. ................ | 364/491 |
| 4,593,351 | 6/1986 | Hong et al. ....................... | 364/491 |
| 4,752,887 | 6/1988 | Kuwahara ......................... | 364/491 |

FOREIGN PATENT DOCUMENTS 62-115574 5/1987 Japan .

OTHER PUBLICATIONS

S. J. Hong, "Wire-Routing Machines-New Tools for VLSI Physical Design", Proceedings of the IEEE, vol. 71, Jan. 1983, pp. 57-65.

VLSI-Very Large Scale Integration, pp. 257-266.

"A Placement Algorithm for Array Processors" by Chyan et al., IEEE 20th Design Automation Conference, 1983, pp. 182-188.

"A Parallel Processing Approach for Logic Module Placement" by Ueda et al., IEEE Trans. on Computer-Aided Design, vol. CAD-2, No. 1, Jan. 1983, pp. 39-47.

Primary Examiner—Vincent N. Trans
Attorney, Agent, or Firm—Fay, Sharpe, Beall, Fagan, Minnich & McKee

[57] ABSTRACT

A wiring route is determined between terminals on an integrated circuit on the basis of information concerning the terminals and areas of the integrated circuit through which a wire can be routed. A mesh memory holds information of mesh points of a wiring area partitioned in a mesh-like pattern. A wavefront memory holds information concerning mesh points constituting the leads of searching point arrays. An expansion point extracting unit selects a source point from the mesh points for a succeeding search from the leading mesh points on the basis of costs. Addresses and costs for mesh points neighboring the source point are calculated. A searching point register holds information concerning the mesh points obtained through the calculation. A determination is made of whether or not the mesh points placed in the searching point register can be searched, and if so they are written to the mesh memory. Duplicate information stored in the searching point register is eliminated. It is then determined whether or not the mesh points corresponding to the terminals to be wired are contained in the searching point register. If so, the wiring route is determined and the process concluded.

6 Claims, 18 Drawing Sheets

FIG. I

S : STARTING POINT OF SEARCH
T : TARGET POINT OF SEARCH
HATCHING : OBSTACLE

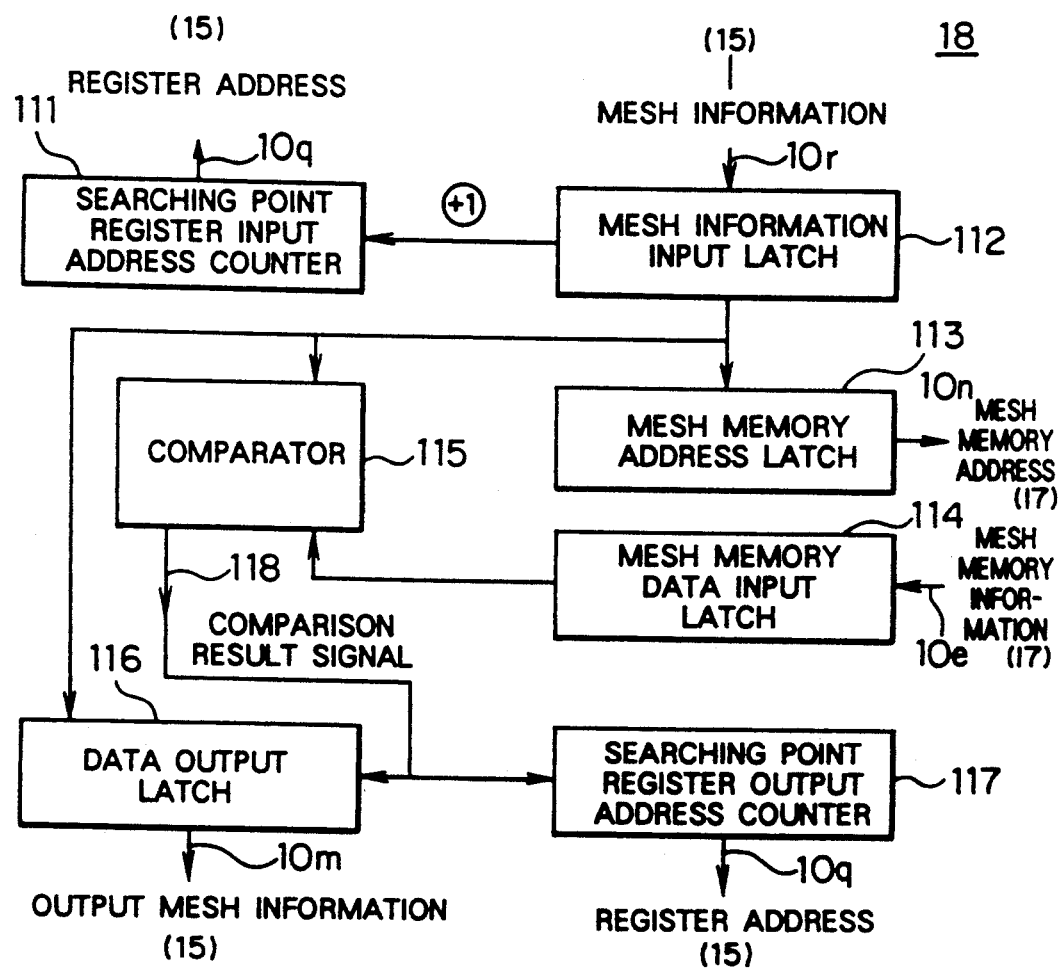

BROKEN LINE ARROWS INDICATE ADDRESSES OF OUTPUT MESH POINT REGISTER AND SOLID LINE ARROWS INDICATE ADDRESSES WRITTEN ACTUALLY

DATA FLOW IN WIRE ROUTING

PROCEDURE OF DUPLICATE TRACE ELIMINATION

APPARATUS FOR WIRE ROUTING OF VLSI

BACKGROUND THE INVENTION

The present invention generally relates to an electronic circuit design system implemented by using an electronic computer. More specifically, the invention is concerned with a wire routing apparatus for automatically designing a wiring pattern for printed boards or substrates and very large scale integrated circuits or VLSIs.

As a typical one of procedures for searching wiring paths or routes in VLSIs, there has already been developed and widely used what is called a maze routing algorithm as well as modified or improved methods thereof. According to the maze routing algorithm, a wire routing area in which wires are to be embedded is divided or partitioned into a plurality of subareas referred to as meshes or mesh points. One of two mesh points which are to be wired together is selected as a starting point, whereon a processing for marking neighbor mesh points through which the wiring path can extend is iterated from one to another mesh point, beginning with the starting point, for thereby detecting a shortest wiring path leading to a sink or target point. Further, as an approach to improve the quality of the routing technique, a method is proposed in which cost involved in the wiring is taken into consideration during the wiring path finding process. In this conjunction, the cost is determined on the basis of information concerning the situations or states of the routing area and/or information concerning the direction in which the wiring path search progresses. The wire routing process is controlled by taking into account the cost. Searching cost is defined as weighting information for determining the priority order of several seachable routes.

An example of such a wire routing procedure will be explained by reference to FIGS. 3A and 3B of the accompanying drawings. FIG. 3A diagrammatically illustrates an example of the maze routing algorithm in which the cost is put aside from consideration. In both of FIGS. 3A and 3B, a symbol S denotes a starting point for the route searching and T denotes a sink or target point thereof. In the figures, hatched areas indicate blockage or obstacle subareas or meshes which inhibit the wiring therethrough. Further, meshes shown in these figures correspond to the mesh points in an actual routing area, wherein numerals inserted in the meshes represent the total of the wiring costs. In the case of the maze routing algorithm illustrated in FIG. 3A, the total wiring cost is uniformly incremented by "1" as the wiring path trace proceeds to any one of the neighbor mesh points regardless of the routing or tracing directions because no consideration is paid to the cost. Consequently, the searching forefront referred to as the wavefront will spread or propagate concentrically around the starting point S. When the total wiring cost amounts to "9", this means that the route or wiring path has been traced up to the sink or target point T.

On the other hand, FIG. 3B shows an example of the maze routing algorithm in which the cost is taken into consideration during the searching process. According to the method illustrated in FIG. 3B, the total of the cost is incremented by "+2" every time the route being traced turns, while it is incremented by "+1" so long as the wiring path can be routed straightforwardly without changing the direction. In case one and the same mesh point is allocated with a plurality of different costs, the tracing direction involving the least cost is selected with preference over the others. By searching the wiring path under these conditions, there can be found the wiring path having the least number of turns (i.e. changes in the tracing direction).

The processing described above is implemented by software running on a general-purpose computer and generally takes an intolerably long time, because substantially all the mesh points of the routing area have to be checked.

According to a wire routing method and apparatus disclosed in S. J. Hong, R. Nair "Wire-Routing Machines—New Tools for VLSI Physical Design", PROCEEDING OF THE IEEE, Vol. 71, No. 1, pp. 57–65, January 1983, U.S. Pat. Nos. 4,484,292 and 4,593,351, the wire routing is carried out by a parallel computer system which includes a plurality of parallel processors interconnected in a mesh array (mesh-connected multiprocessor complex). These known routing schemes are founded on the fact that the wavefront processing mentioned above is susceptible to parallel execution, and thus processings of the mesh points covered by the wavefront are allocated to a plurality of processors capable of operating in parallel. More specifically, element processors are allocated to the mesh points within the area of concern in one-to-one correspondence, wherein upon propagation of search information from the element processor allocated to a given one of the neighbor mesh points, the search information is also transmitted to the other processors allocated to the remaining neighbor mesh points, respectively. Further, Japanese Patent Publication JP-B-58-42621 discloses a wire routing apparatus which comprises a plurality of mesh-connected processing units each constituted by a memory element which can be controlled externally. In a parallel wire routing scheme taught in JP-A-62-115574, a wiring area is partitioned into a plurality of subareas, wherein wirings in these subareas are executed by a number of cell computers assigned to these subareas, respectively.

As previously described, the processing for searching the wiring paths requires such an enormous amount of time that wiring for an LSI of the next generation will take a time on the order of 100 hours even if a large scale computer of the highest speed available at present is used. Such being the circumstances, the rewriting resulting from changes in the design as well as manufacturing of various LSIs on a small production basis exerts serious influence to assuarance of good productivity. Accordingly, there exists a great demand for a faster wire routing technique from the economical standpoint as well.

The problems mentioned above are believed to be ascribable to the fact that the wire routing processing is executed by software running on a general-purpose computer system. More specifically, with the software, the wire routing functions mentioned above are realized through sequential and iterative processings by combining basic instructions such as assignment processing, arithmetic processing, execution control processing and others. On the other hand, the wiring path search processing can be executed simultaneously for a plurality of locations within a routing area through a so-called parallel processing. However, in the parallel computer complex in which element processors are simply connected in a mesh-structure as in the case of the prior art wire routing systems mentioned above, the number of the processors actually put into parallel operations during the search processing is limited even when a great number of processors are provided. This means that the improvement with respect to the processing speed unfortunately remains low notwithstanding increases in the amount of hardware employed. More concretely, in the case of the prior art technique based on the maze routing algorithm, data susceptible to the parallel processing is only the one-dimensional data constituting the wavefront. Consequently, even when the data processing is dispersed or distributed to a plurality of processors arrayed two-dimensionally or three-dimensionally, a majority of processors can not operate simultaneously. Furthermore, since the processing speed of the prior art routing system can not be improved more than by a factor corresponding to a value several times as large as the number of the mesh points belonging to the wavefront at the most and because the individual processors execute simple processing by using software, the low-speediness of the processing can not be improved to any appreciable extent. Besides, in the parallel processing system in which the routing area is divided into plural subareas, coordinated operations of the cell computers are necessary for execution of the wire routing across and through a plurality of subareas, which will unavoidably be accompanied with lowering in the processing speed.

SUMMARY OF THE INVENTION

An object of the present invention is to provide an improved apparatus suited for VLS wire routing which allows processing time taken for the route searching to be significantly reduced.

In view of the above and other objects which will become more apparent as description proceeds, there is provided according to the invention in its broadest sense a wire routing apparatus in which parallel processing for the wavefront in the VLSI wire routing process is allocated to a plurality of hardware resources and in which data-related processings are executed by hardware units rather than by software.

The wire routing apparatus according to an aspect of the invention includes a wavefront memory for holding information of individual mesh points belonging to the wavefront and a searching point register for holding information of succeeding searching points, wherein basic operations for the route searching are realized by hardware units by way of which data transfer is realized between the wavefront memory and the searching point register.

The wavefront memory is adapted to hold those addresses of the mesh memory holding the information of all the mesh points in the routing area at which the information of a set of mesh points already traced and distanced most remotely from the search starting point are stored. The wavefront memory is thus capable of holding a plurality of addresses for the mesh points and managing parallelwise the mesh points included in the wavefronts making appearance during the routing process.

The aforementioned hardware units include an expansion point extracting unit, a neighbor address calculating unit and a cost calculating unit, wherein processings for extracting the mesh point from the wavefront to calculate the coordinates and costs of the succeeding mesh points (which have conventionally been implemented by software) are executed by the hardware units mentioned above.

The searching point register is designed to store temporarily the information of the succeeding mesh points to be checked, which information is supplied from the neighbor address calculating unit and the cost calculating unit. In other words, the information of all the mesh points to be next traced is stored in this searching point register.

Since the wiring path finding processing is executed in parallel, there arises a possibility that tracing information might be stored in the searching point register in duplicate for a mesh point of the same coordinates. In that case, the duplicate trace is inhibited by using the mesh memory and a duplicate trace eliminating unit. Individual memory units or cells constituting the mesh memory correspond, respectively, to these mesh points which are subjected to the wiring path search processing and hold information indicating whether or not the associated mesh points can be used as parts of the wiring route, information indicating whether or not the associated mesh points have already undergone the search processing (i.e. already traced) and the information concerning the searching or tracing directions. The duplicate trace eliminating unit reads out from the mesh memory the information of the mesh point indicated by the aforementioned searching point register and compares the information with the mesh point information stored in the searching point register. In accordance with the result of the comparison, information concerning the mesh point of the same coordinates is deleted from the searching point register.

Because the wavefront memory and the searching point register are capable of managing information concerning a plurality of mesh points and because they can manage en bloc the information concerning the mesh points belonging to the wavefront and those which can be searched from the wavefront, the parallel processing in appearance can be realized. Further, the succeeding searching point calculation as well as associated cost calculation performed conventionally by software are executed by the neighbor address calculating unit and the cost calculating unit, and these calculations are executed in parallel for all the directions to be traced at the time when data are transferred from the wavefront memory to the searching point register.

As will be understood from the foregoing, it is taught according to the invention to provide a plurality of hardware units for the data which are susceptible to simultaneous processings for thereby enabling the parallel processing while providing the dedicated units for the data processing such as the calculation of the searching points or coordinates, for thereby accomplishing the wire routing processing at a remarkably increased speed.

BRIEF DESCRIPTION OF THE DRAWINGS

FIG. 11 is a block diagram showing a configuration of a duplicate trace eliminating unit;

FIG. 12 is an illustration of the conditions for a duplicate trace eliminating operation;

DESCRIPTION OF THE PREFERRED EMBODIMENTS

Figure 1:
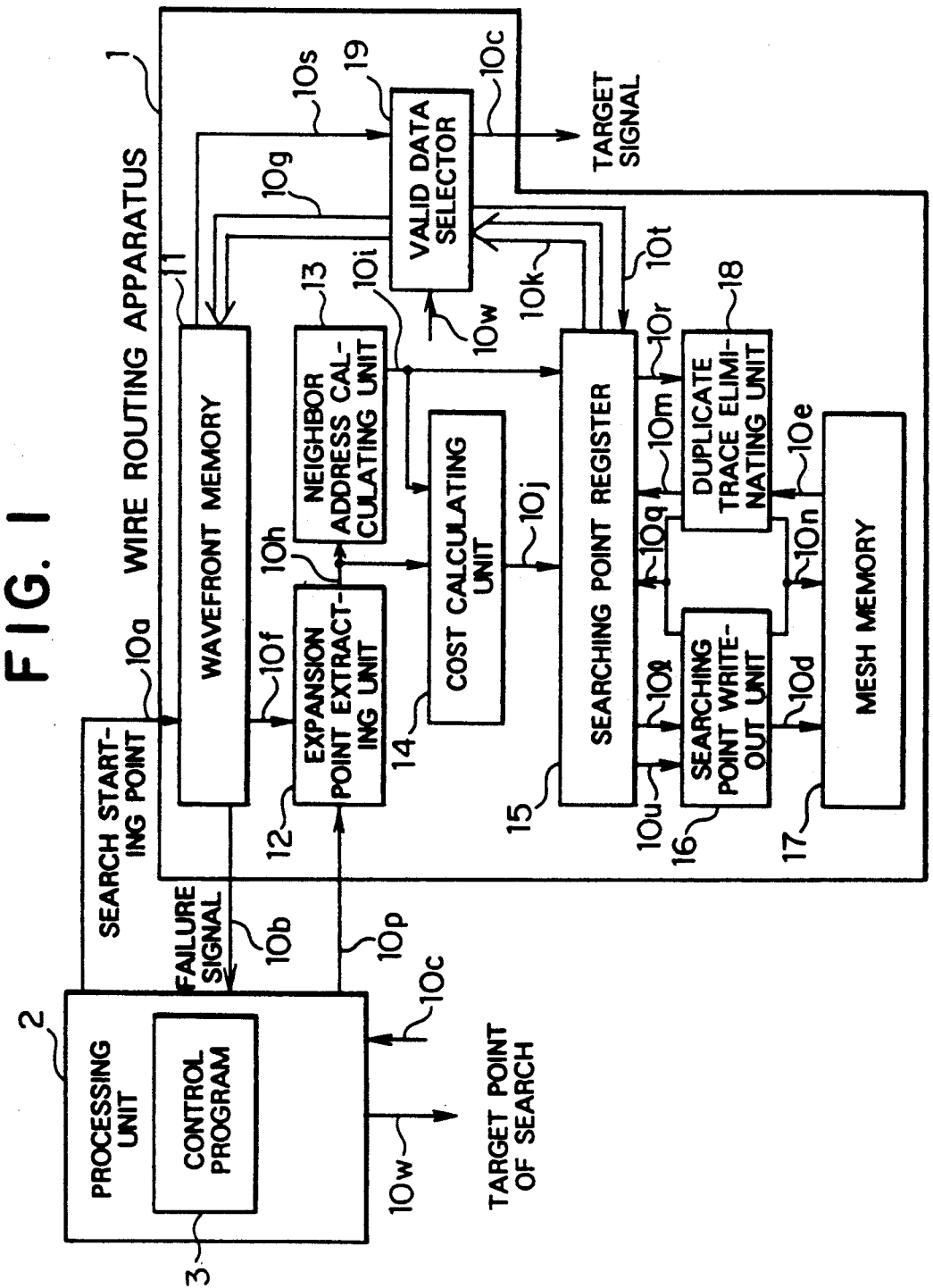
FIG. 1 is a block diagram showing a general arrangement of a wire routing apparatus according to an embodiment of the present invention.

The present invention will now be described in detail in conjunction with preferred or exemplary embodiments thereof by referring to the drawings.

FIG. 1 shows a general arrangement of a wire routing apparatus according to an embodiment of the invention. The wire routing apparatus denoted generally by a numeral 1 operates in accordance with various control signals supplied from a processing unit 2 having a control program 3. The wire routing apparatus 1 includes a wavefront memory 11, an expansion point extracting unit 12, a neighbor address calculating unit 13, a cost calculating unit 14, a searching point register (writer) 15, a searching point write-out unit 16, a mesh memory 17, a duplicate trace eliminating unit 18 and a valid data selector 19.

Figure 2:
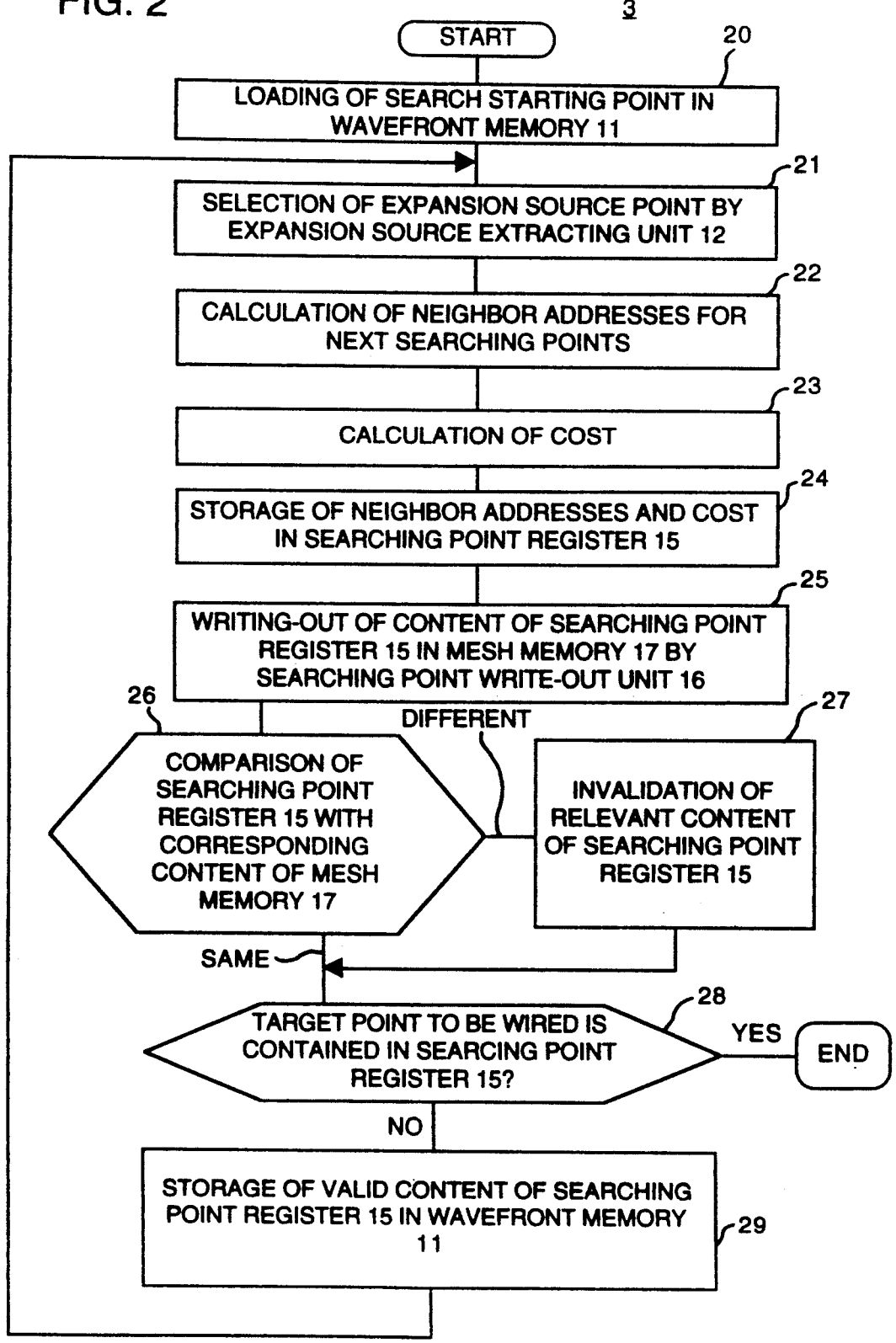
FIG. 2 is a flow chart for illustrating a wire routing processing according to a method carried out by the apparatus shown in FIG. 1.

FIG. 2 is a flow chart for illustrating processing executed by the wire routing apparatus 1 which operates under the control of the program 3.

Figure 3A:
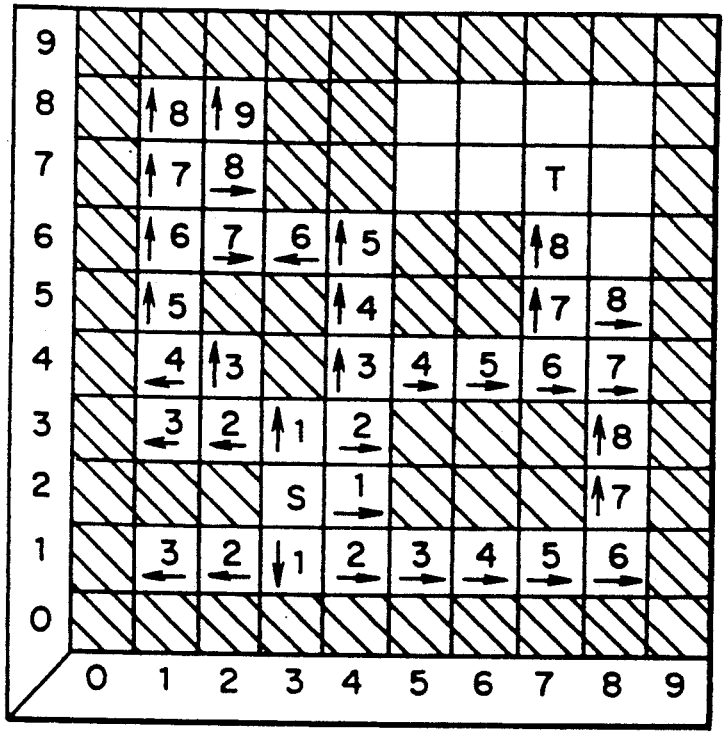
FIGS. 3A and 3B are illustrations showing examples of routing algorithms.
Figure 3B:
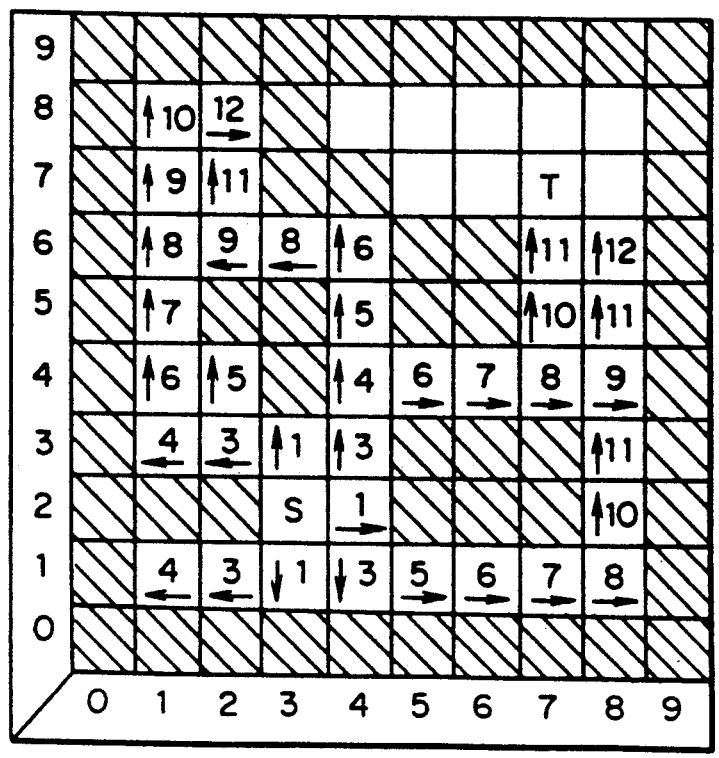

In the first place, description will be made generally of the operation of the wire routing apparatus 1 by reference to FIG. 1 together with the flow chart shown in FIG. 2 and FIG. 3B which shows a routing area, by way of example. In FIG. 3B, the coordinates of a mesh point (i.e. address thereof) are represented by (X, Y). Further, numerals and arrows in the figure indicate wiring costs (i.e. costs involved in wiring through the associated meshes) and the tracing directions, respectively. In a cost calculating method as adopted in the illustrated wire routing apparatus, it is assumed that the cost is incremented by "+2" every time the tracing direction changes in the course of tracing the route and otherwise it is incremented by "+1". It should however be noted that the teachings of the invention incarnated in the embodiment described below can equally be applied to a cost calculating method in which the cost is incremented by "+1" independent of the tracing direction.

At first, a search starting point S (3, 2) shown in FIG. 3B is loaded in the wavefront memory 11 (step 20 in FIG. 2). The expansion point extracting unit 12 selects from the wavefront memory 11 information of a mesh point for which the cost is the least (step 21). Initially, the starting point S (3, 2) is selected. The neighbor address calculating unit 13 calculates the coordinates of neighbor addresses of succeeding or neighbor mesh points (step 22). For the starting point (3, 2), there will be determined mesh points (3, 3), (2, 2), (3, 1) and (4, 2) as the neighbors, respectively, which are then loaded in the searching point register 15 (step 24). At that time, corresponding costs are simultaneously calculated by the cost calculating unit 14 (step 23). In the case of the embodiment now under consideration, the mesh point (3, 2) is the starting point. Accordingly, the costs for the neighbors mentioned above are all "1". The costs thus determined are then loaded in the searching point register 15 in association with the aforementioned neighbor points, respectively (step 24).

The searching point write-out unit 16 checks the contents of the searching point register 15. When a mesh point is found to be usable for the wiring as the result of the check, the searching point register 15 transfers the information of that mesh point to the mesh memory 17 (step 25). In the case of the example illustrated in FIG. 3B, the mesh point (2, 2) represents an obstacle point for the wiring. Accordingly, only the information of the mesh points (3, 3), (3, 1) and (4, 2) inclusive of the tracing direction and the search-over information is written out to the mesh memory 17.

The duplicate trace eliminating unit 18 again reads out from the mesh memory 17 the mesh point information designated by the searching point register 15 to compare the content of the mesh memory 17 with that of the searching point register 15 (step 26). When the comparison result shows that the content of the mesh memory 17 differs from that of the searching point register 15, this means that the information concerning the same mesh point(s) has once been placed in the searching point register 15. Accordingly, the duplicate trace eliminating unit 18 invalidates the corresponding information of the searching point register 15 (step 27). Further, since the tracing is interrupted when a mesh point of interest represents the wiring obstacle or blockage point, the corresponding content in the searching point register 15 is invalidated as well (step 27). In the case of the example illustrated in FIG. 3B, no duplicate writing-out is performed. Accordingly, the information of all the mesh points (3, 3), (3, 1) and (4, 2) placed in the searching point register 15 is regarded to be valid.

Subsequently, the valid data selector 19 makes determination as to whether or not a target mesh point T to be connected to the starting point S is contained in the searching point register 15 (step 28). When the target point T is found in the searching point register 15, the processing comes to an end. Unless the target point T is contained in the searching point register 15 or in case another target point to be searched exists, the contents of the searching point register 15 are stored in the wavefront memory 11 in a sequence conforming to the costs which the respective mesh point information indicates (step 29), whereon return is made to the processing step 21.

Through the processing routine described above, the information concerning the mesh points (3, 3), (3, 1) and (4, 2) is stored in the wavefront memory 11. Thereafter, a series of processing steps 21 to 28 is iterated until the target point T (7, 7) for the wire routing has been reached. In this conjunction, it will be understood that a mesh point (4, 3) may be reached through the searches starting from both mesh points (4, 2) and (3, 3), respectively. In that case, there is left in the mesh memory 17 only the information written later. The duplicate trace elimination unit 18 invalidates the content or data obtained from the searching performed earlier for the mesh point (3, 3). Similar duplicate trace elimination processing is performed for the mesh point (4, 1) and the like.

In the case of the instant embodiment, the cost is incremented by "+1" when the tracing proceeds in the same direction as that of the tracing performed immediately before, while the cost is incremented by "+2" when the tracing proceeds in a different direction. Consequently, the costs involved in reaching the mesh points (4, 5) and (5, 4) through the tracing from the mesh point (4, 4) amount to "5" and "6", respectively. At that time, the valid data selector 19 classifies the different mesh points such as the mesh point (4, 5) having the cost value "5" and the mesh point (5, 4) having the cost value "6" upon storage in the wavefront memory 11.

Next, description will be made in detail of operations of the individual units shown in FIG. 1. At this juncture, it should be mentioned that in the figures referred to in the following description, parenthesized numerals attached to the roots or heads of arrows representing signal lines indicate source circuits from which the signals originate, or destination circuits to which the signals are to be sent, respectively.

Figure 4:
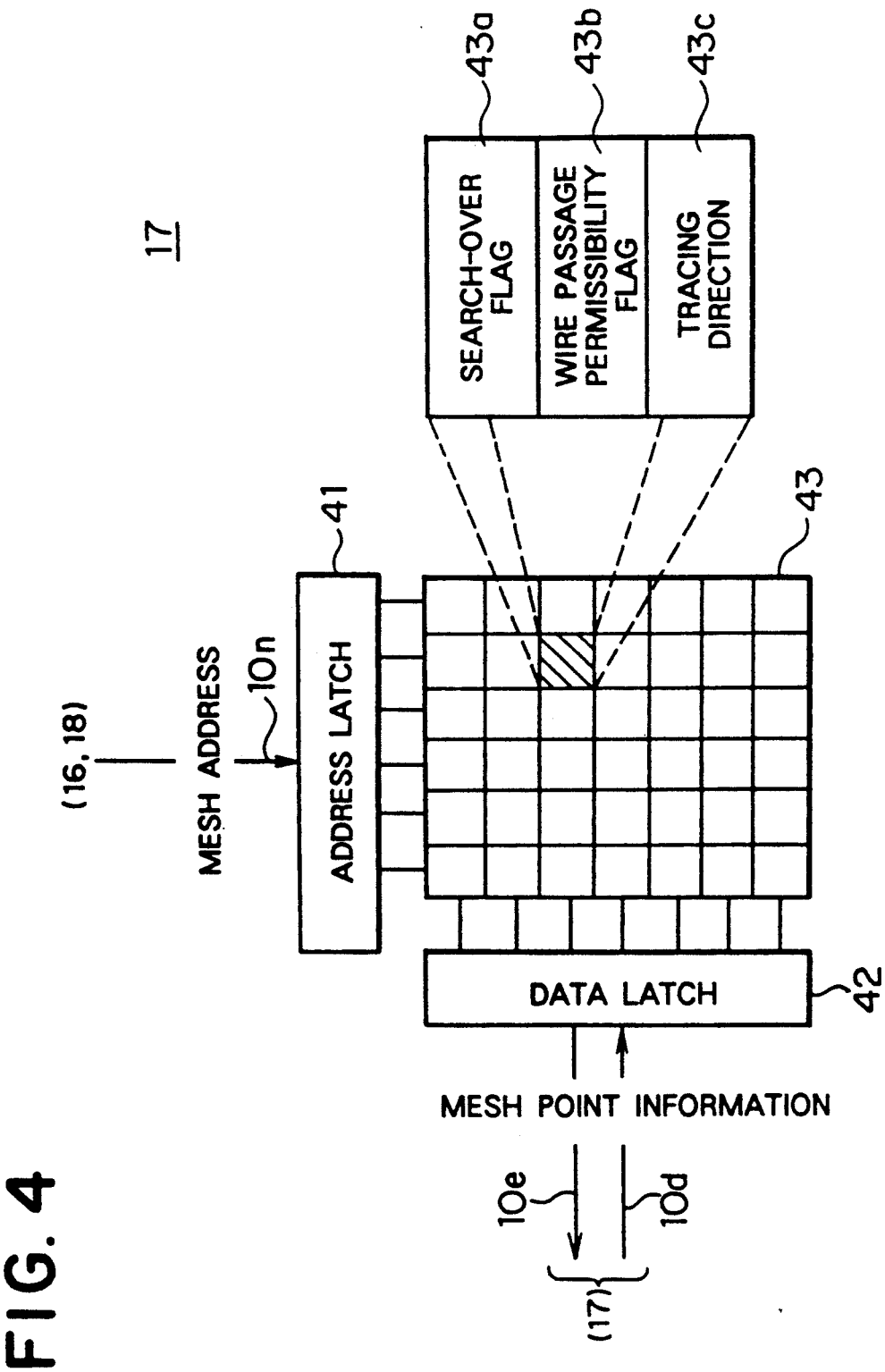
FIG. 4 is a block diagram showing a structure of a mesh memory of the apparatus shown in FIG. 1.

FIG. 4 diagrammatically shows an exemplary arrangement of the mesh memory 17. The memory 17 may be realized by using a conventional random access memory (RAM). In FIG. 4, a reference numeral 41 denotes an address latch to which an address corresponding to the coordinates of a mesh point which is to be accessed is inputted, while a data latch 42 is loaded with information of a searching point which is to be read out via a signal line 10e or which is to be written via a signal line 10d. A data storage part 43 includes data storage elements or cells in one-to-one correspondence to the mesh points of the routing area, wherein each of the data storage cells stores a search-over flag 43a, the tracing direction 43c and a wire passage permissibility flag 43b. Parenthetically, when the number of memory cells of the data storage part 43 arrayed in the direction in which the addresses are to be assigned is represented by M, correspondence relation between the coordinates (m, n) of a mesh point (where m is in a range of 0 to M−1 with n in a range from 0 to N−1) and the address L is given by the following expression (1). (Incidentally, in the case of the example shown in FIG. 3, M=10.)

$$L = Mn + m + 1 \qquad (1)$$

The address can be determined from the coordinates of the mesh point in accordance with the above expression (1). On the other hand, when the coordinates of the mesh point are to be determined from the address, the following expression (2) is used.

$$n = [(L-1)/M], \quad m = L - Mn - 1 \qquad (2)$$

where a symbol and [ ] represents an Gauss' symbol and [X] represents arithmetic operation for determining a maximum integer which does not exceed "X". The neighbor mesh points located above, underneath, right and left to the mesh point having the address L have respective addresses "L+M", "L−M", "L−1" and "L+1". In this conjunction, changes "+M", "−M", "−1" and "+1" from the address L represent offset values in the tracing direction, as will be explained later on.

Figure 5:
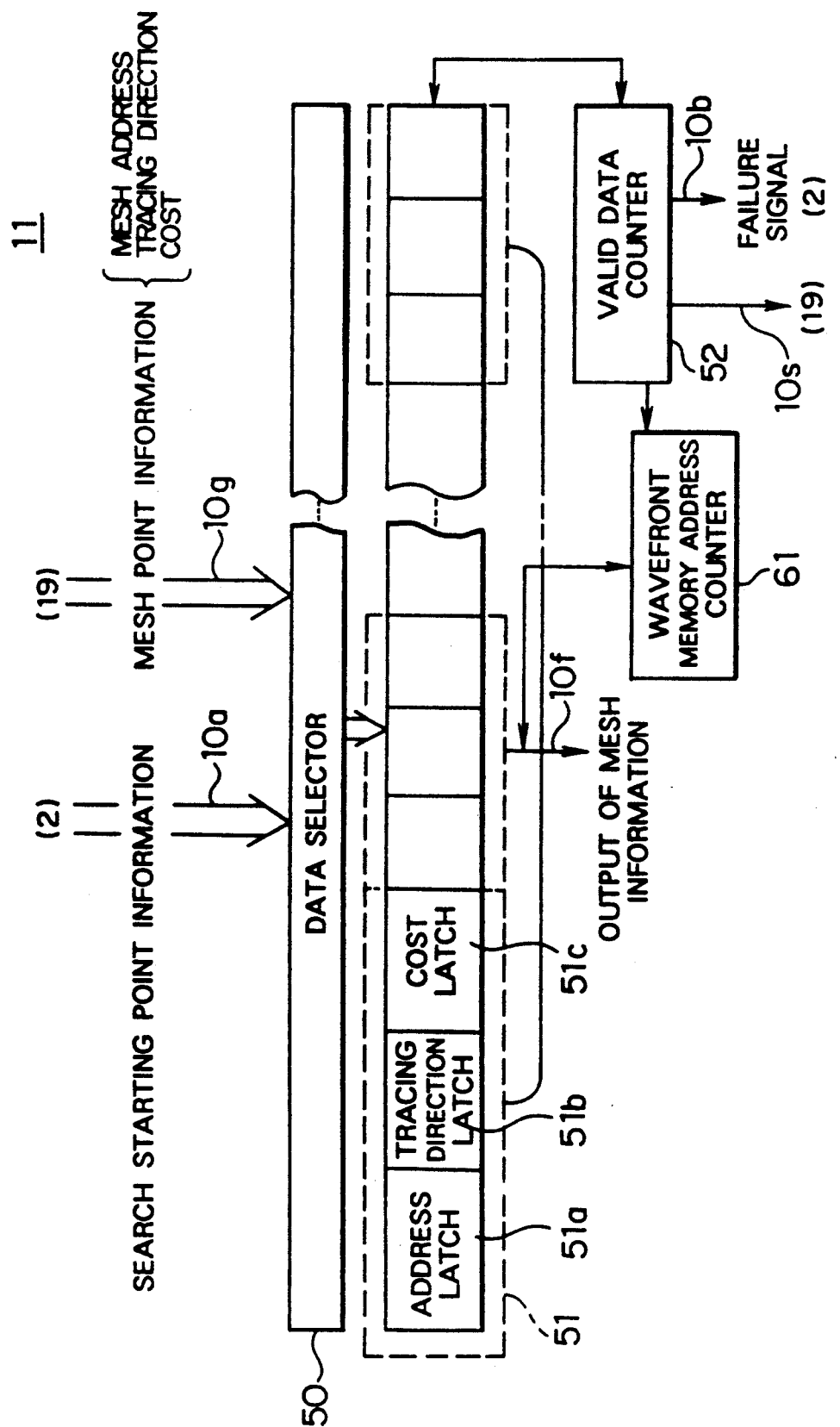
FIG. 5 is a block diagram showing a structure of a wavefront memory employed in the apparatus shown in FIG. 1.

FIG. 5 shows, by way of example, a structure of the wavefront memory 11. A searching point information latch array 51 is provided in correspondence to one mesh point and stores therein the information of address of the mesh memory, tracing direction and the cost for the corresponding one mesh point. The wavefront memory 11 includes a plurality of such searching point information latches 51 for storing en block information of plural mesh points forming a wavefront such as described hereinbefore in conjunction with the maze routing algorithm. More specifically, each of the searching point information latch arrays 51 is composed of an address latch 51a, a tracing direction latch 51b and the cost latch 51c in which the mesh address, the tracing direction and the cost are loaded to be outputted as the searching point information via the signal line 10f. A valid data counter 52 serves to count the number of the mesh points having the information stored in the wavefront memory 11. A wavefront memory address counter 61 counts the number of times the data is read out from the waveform memory 11 until a value set at the valid data counter 52 has been attained. In case the value of the valid data counter 52 is "0" (zero), decision is made that the wiring pat could not be found, as a result of which a failure signal 10b is set to a high level. In the case of the example illustrated in FIG. 3B, the mesh points (5, 1), (4, 4), (2, 4), (1, 3) and (1, 1) form a wavefront and are stored in the wavefront memory 11. At that time, the count value of the valid data counter 52 is "5", indicating that the number of the mesh points forming the wavefront is five.

Figure 6:
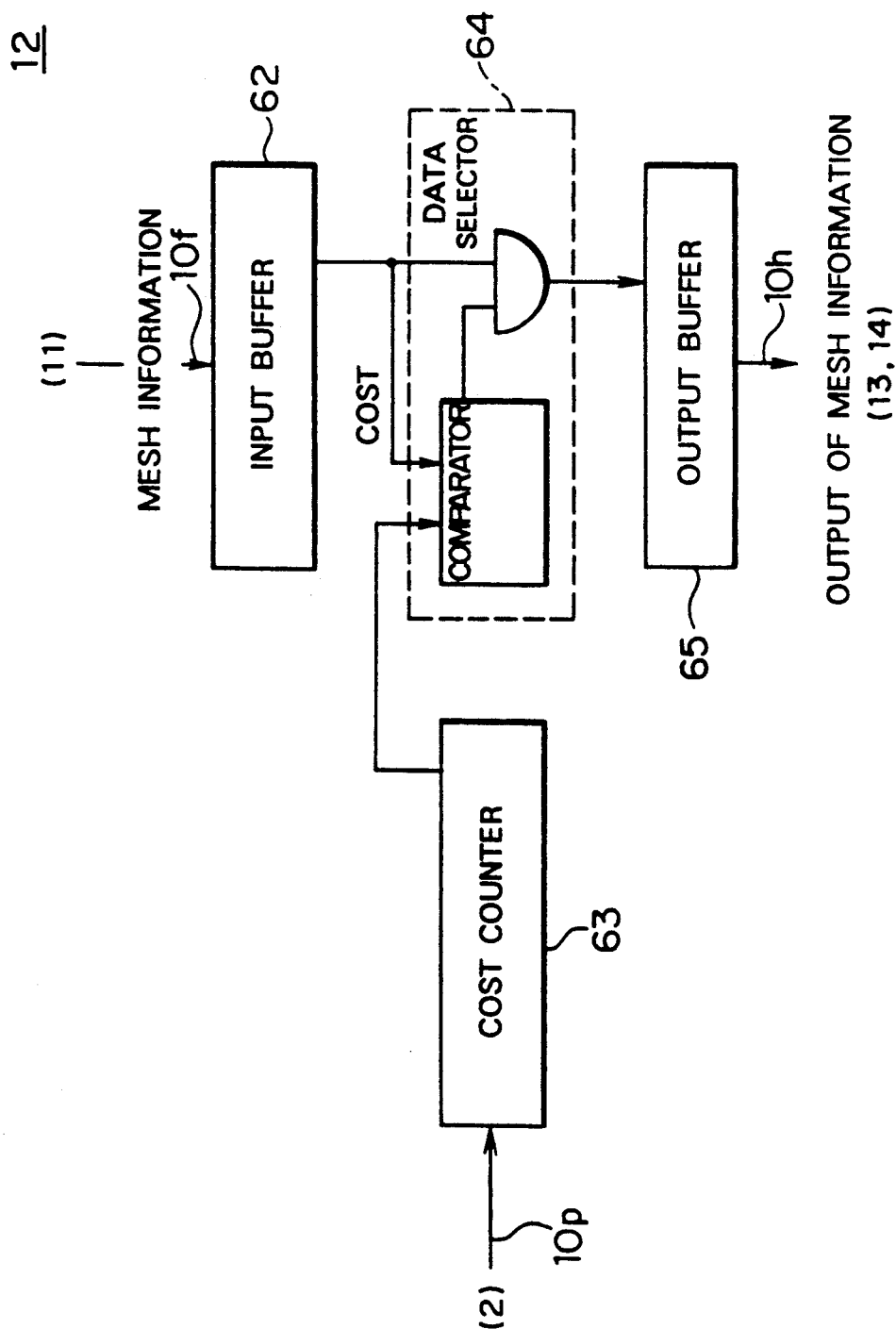
FIG. 6 is a block diagram showing a configuration of an expansion point extracting unit of the apparatus shown in FIG. 1.

FIG. 6 shows an exemplary configuration of the expansion point extracting unit. Referring to the figure, an input buffer 62 serves for storing data transferred thereto from the wavefront memory 11. A cost counter 63 serves to hold the cost of the mesh point which constitutes an expansion source point. A data selector 64 selects the mesh point data coinciding with the cost value held by the cost counter 63 the selected data being then transferred to an output buffer 65. In the case of the instant embodiment, the cost value of concern is "4". Accordingly, the mesh points (1, 1), (1, 3) and (4, 4) of those enumerated above are transferred to the output buffer 65.

Figure 7:
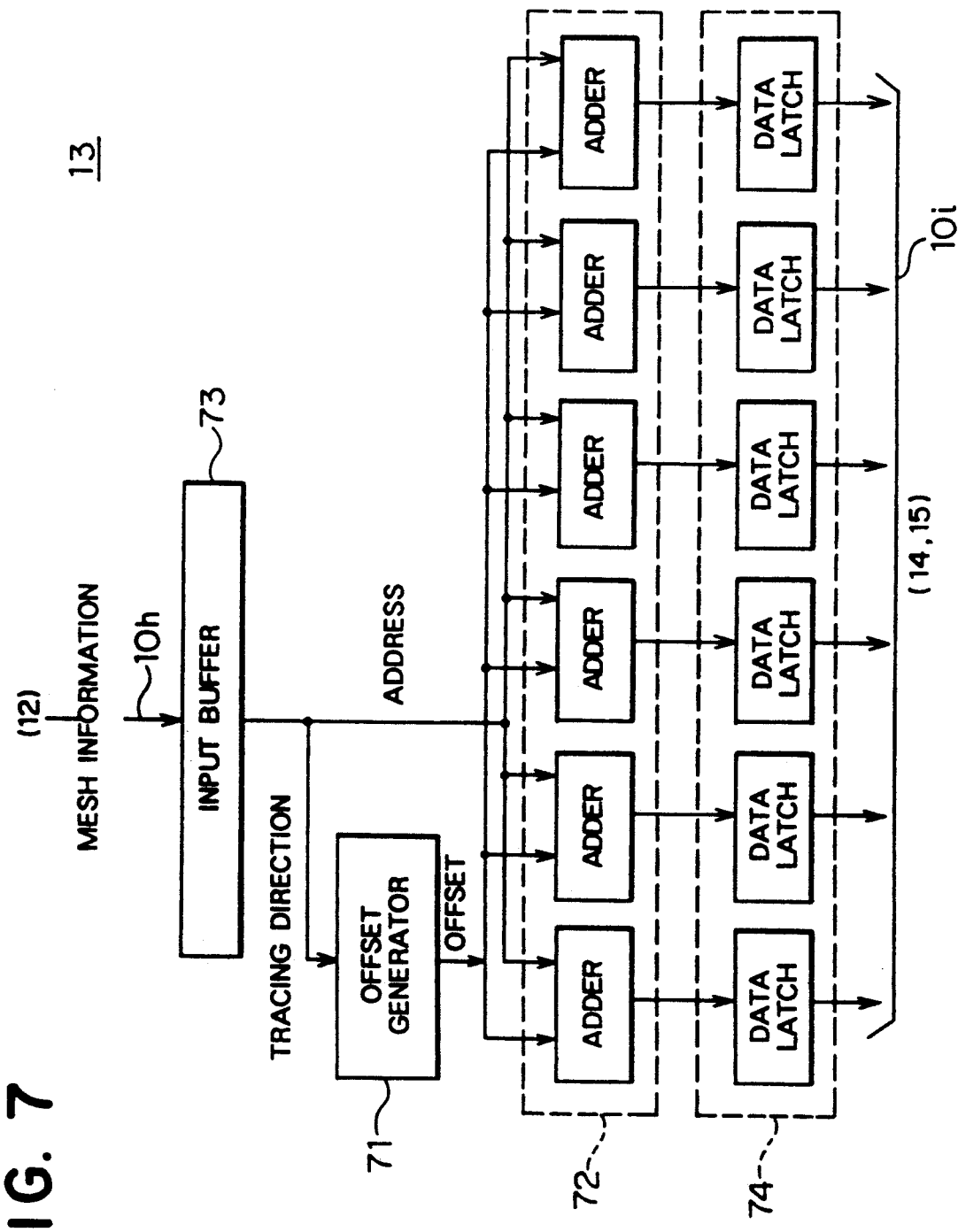
FIG. 7 is a block diagram showing a configuration of a neighbor address calculating unit.

FIG. 7 shows an exemplary configuration of the neighbor address calculating unit 13. An offset generator 71 has an input supplied with the tracing direction of the searching point information stored in an input buffer 73 to thereby output a corresponding offset value. Subsequently, the offset value is inputted to an adder circuit 72 together with the address extracted from an input buffer 73, whereby an address of the mesh point to which the tracing is to procede is outputted. In conjunction with the example illustrated in FIG. 3B, let's assume that the mesh point (0, 0) is assigned with the address "1", the mesh point (2, 0) is assigned with the address "3" and so forth with the mesh point (1, 1) being assigned with the address "12" in accordance with the expression (1). On the assumption, as the succeeding searching points of the input mesh point (1, 1), there can be determined the addresses "11", "2" and "22", wherein the mesh points corresponding to these addresses are (0, 1), (1, 0) and (1, 2), respectively. Accordingly, for the mesh points (1, 3) and (4, 4), there are determined the offset values "+10", "−1", "−10" and "+1", "+10", "−1" which correspond to the mesh points (1, 4), (0, 3), (1, 2) and (5, 4), (4, 5) and (3, 4), respectively. By adding these offset values to the address corresponding to the coordinates of the origin mesh points, the coordinates to be newly traced can arithmetically be determined. In order to allow the wire routing apparatus according to the invention to be applied to a three-dimensional wire routing method as well, there are provided six adders 72 and six data latches 74 in the neighbor address calculating unit 13 shown in FIG. 7 so that the processings corresponding to six tracing directions, respectively, can simultaneously be executed. Since the tracing directions and the offset values are combined in one-to-one correspondence, the simultaneous processings mentioned above can easily be realized by using a combinatory logic circuit. Alternatively, the combinatory logic circuit for determining the offset value from the tracing direction may be replaced by a memory having addresses corresponding to the tracing directions. In that case, by storing the offset values corresponding to the tracing directions as the data contents of the memory, functions similar to that of the combinatory logic circuit can be implemented. In other words, by designating the address instead of the tracing direction, there can be obtained the offset value. An output buffer 74 composed of data latches provided in correspondence to the individual addresses serves for data transaction with the cost calculating units 14 and the searching point register 15.

Figure 8:
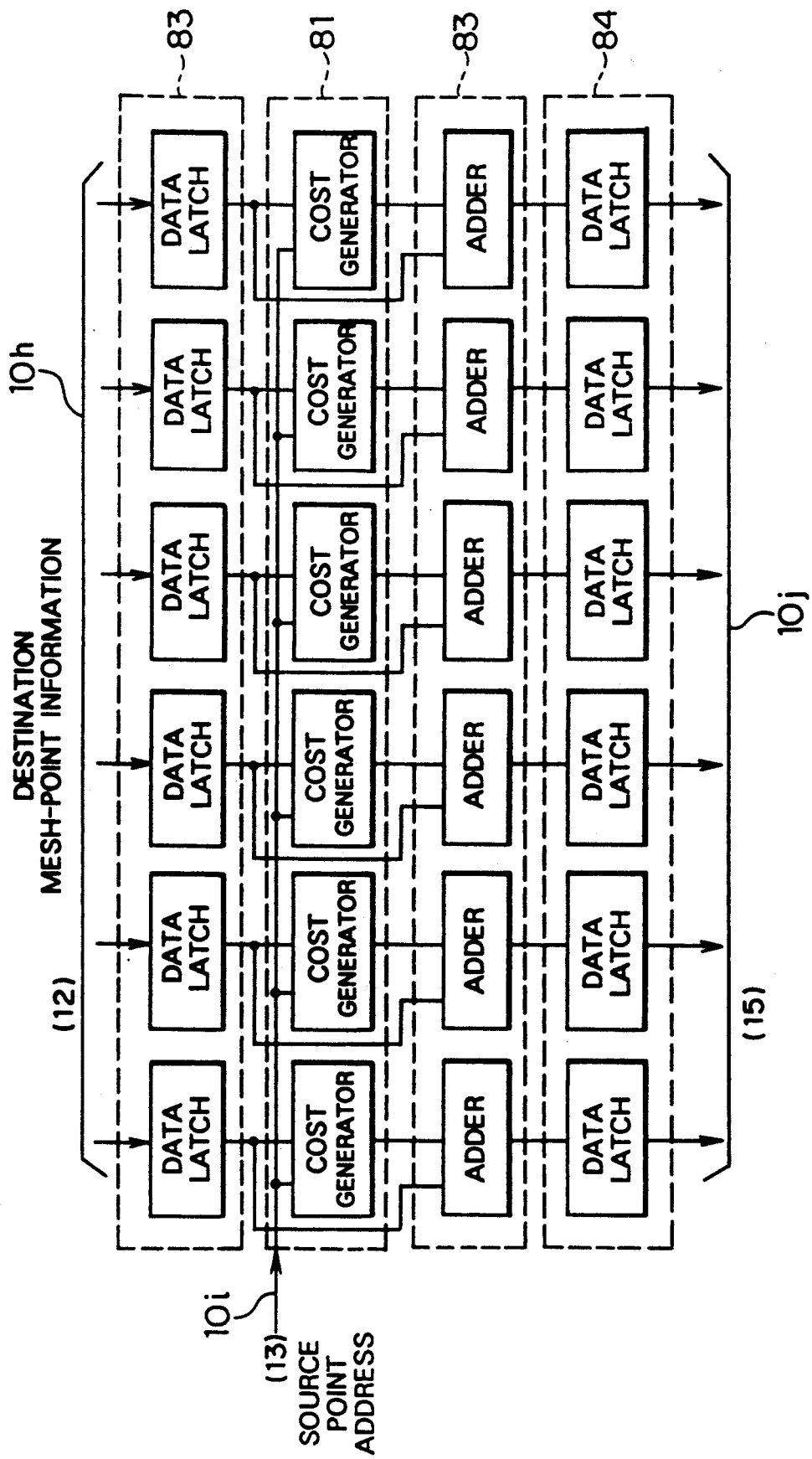
FIG. 8 is a block diagram showing a configuration of a cost calculator.

FIG. 8 shows an exemplary structure of the cost calculating unit 14. A cost generator 81 has inputs supplied with information of the tracing direction of the mesh point constituting the source point and the tracing direction of a newly traced mesh point for thereby generating the cost involved in the relevant wire routing. In the case of the example illustrated in FIG. 3B, a cost increment of "+1" is generated when the tracing directions of both meshes mentioned above coincide with each other, while a cost increment of "+2" is generated when both meshes differ from each other in the tracing direction. A cost adder 82 adds the cost generated by the cost generator 81 to the cost of the source mesh point to thereby generate the cost of the newly traced mesh point. In a practical application, the cost generator 81 may be constituted by a memory having addresses corresponding to the tracing directions, and the cost values to be added may be stored in the memory. With this arrangement, similar functions mentioned above can equally be realized. In other words, by designating a corresponding address of the memory instead of the tracing direction, the cost value can be obtained. An input buffer 83 and an output buffer 84 each constituted by a data latch provided in association with the cost calculation serve as buffer circuits for data transfers with the other units 12 and 15. In order to allow the wire routing apparatus according to the invention to be applied to a three-dimensional wire routing, there are provided six cost generators 81, six adders 82 and six data latches 83 and 84 in correspondence to the tracing directions, respectively, so that the processing in the six tracing directions can simultaneously be executed.

Figure 9:
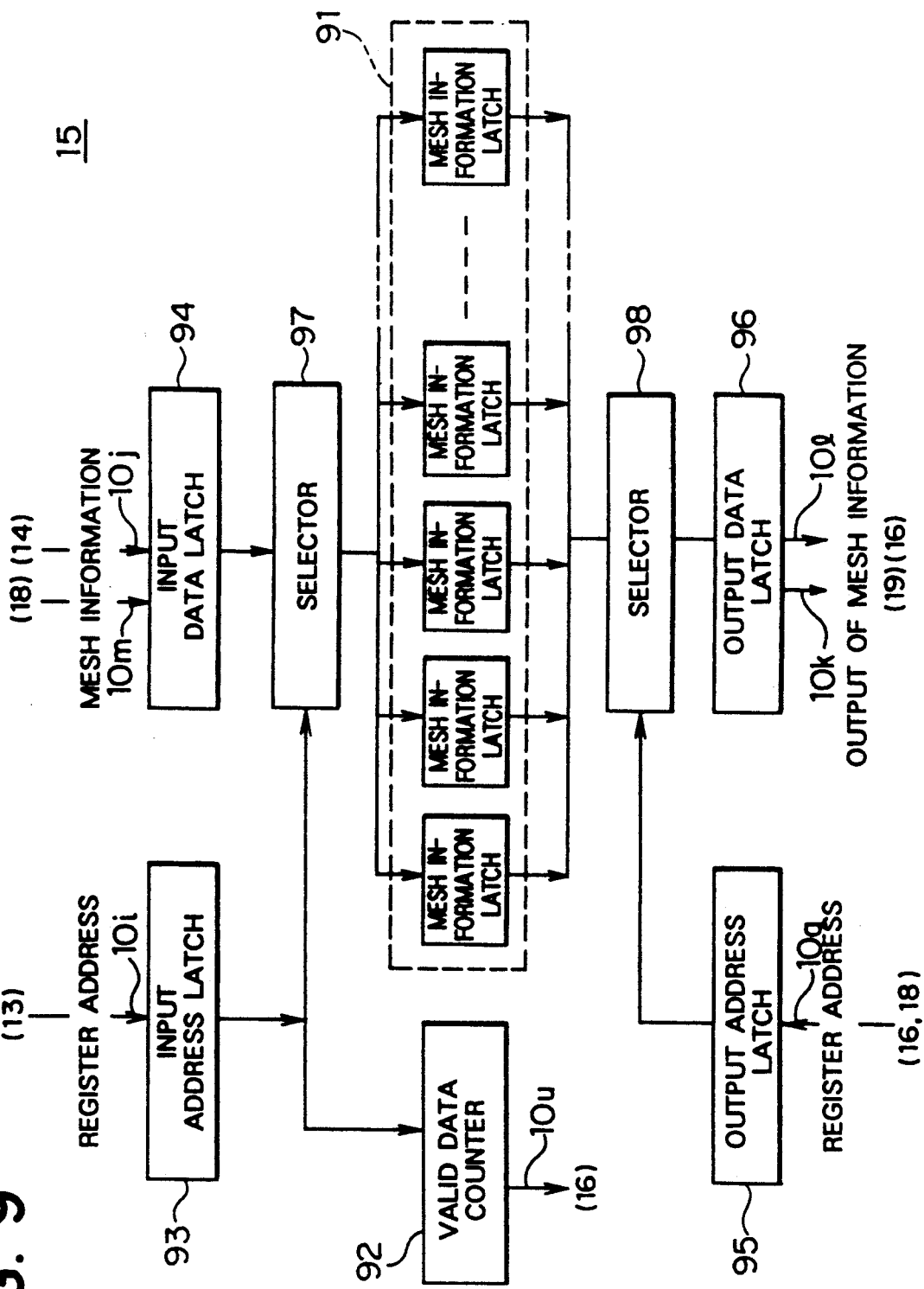
FIG. 9 is a block diagram showing a structure of a searching point register.

FIG. 9 shows an exemplary structure of the searching point register 15. A searching point data storage part 91 serves to hold the searching information including the mesh memory address, the tracing direction and the cost for each of the mesh points through an input selector 97 as in the case of the wavefront memory. A valid data counter 92 is adapted to count the number of the mesh points whose data are stored in the mesh data storage part 91. An input address latch 93 and an input data latch 94 serve to hold the register address for writing the mesh information in the searching point register and the information of the mesh point to be written. Since the maximum number of the neighbor meshes for one mesh determined by the neighbor address calculating unit 13 described previously is six in the case of the three-dimensional routing, each of the input address latch 93 and the input data latch has to be capable of holding the data for six mesh points at one time at maximum. An output address latch 95 and an output data latch 96 serve to hold the register address for reading the searching point register 15 and the data as read out, respectively. Since the data reading from the searching point register 15 is performed on a one-by-one mesh basis, it is sufficient for the output address latch 95 and the output data latch 96 to have a capacity for accommodating data for one mesh point. In the case of the example illustrated in FIG. 3B, the information of the mesh points (0, 1), (1, 0), (1, 2), (1, 4), (0, 3), (1, 2), (5, 4), (4, 5) and (3, 4) are stored.

Figure 10:
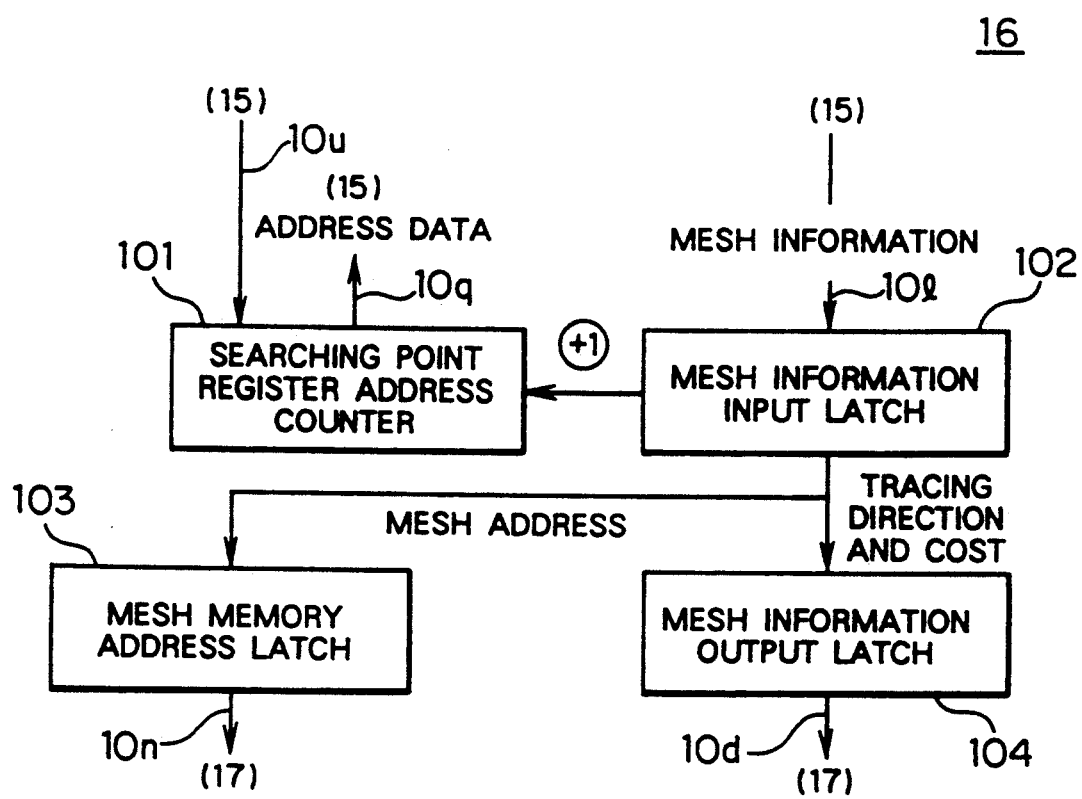
FIG. 10 is a block diagram showing a configuration of a searching point write-out unit.
Figure 13:
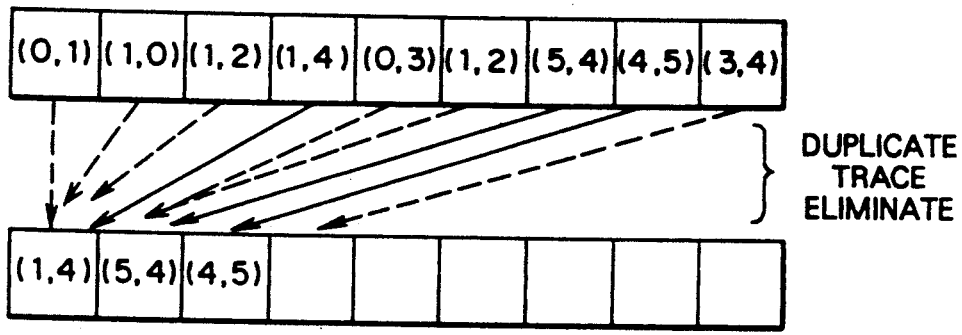
FIG. 13 is an illustration of a duplicate trace elimination processing.

FIG. 10 is a block diagram showing an exemplary structure of the searching point write-out unit 16. A searching point register address counter 101 serves for holding the address for reading data from the searching point register 15. The data reading from the searching point register 15 is performed on a one-by-one mesh basis. A counter 101 counts up one by one until a value set at the valid data counter 92 is reached. A mesh information input latch 102 is loaded with the content of the searching point register 15. Of the searching point information, the mesh address information is transferred to a mesh memory address latch 103, while information of the tracing direction and the cost is transferred to a searching point information output latch 104. An output signal 10n of the mesh memory address latch 103 and an output signal 10d of the searching point information output latch 104 represent the address signal and the data signal of the mesh memory 17, respectively. In the case of the example illustrated in FIG. 3B, there are written in the mesh memory 17 the information of the searching points (0, 1), (1, 0), (1, 2), (1, 4), (0, 3), (1, 2), (5, 4), (4, 5) and (3, 4).

FIG. 11 is a block diagram showing an exemplary structure of the duplicate trace eliminating unit 18. Operations of a searching point register input address counter 111 and a searching point information input latch 112 are performed in the utterly same manner as described above in conjunction with the searching point write-out circuit 16, whereby the searching point data stored in the searching point register 15 are sequentially written in the searching point information input latch 112. Of the searching point information, the mesh memory address information is transferred to a mesh memory address latch 113 to be used as the address information for reading out the content of the mesh memory 17. A mesh memory data input latch 114 is loaded with the content of the mesh memory 17 which corresponds to the address outputted from the abovementioned mesh memory address latch 113. A comparator 115 compares the searching point information held by the searching point information input latch 112 with the data of the mesh memory 17 held by the mesh memory data input latch 114, whereon the result of the comparison is supplied to a data output latch 116 and a searching point register output address counter 117 as a comparison result signal 118. Conditions for the comparison are listed in a table 120 shown in FIG. 12. When the tracing direction changes or when the mesh memory data indicates a wiring obstacle or blockage, the comparison result signal 118 assumes a high level. The data output latch 116 serves as a data transfer buffer for transferring the content of the aforementioned searching point information input latch 112 to the searching point register 15. This data transfer operation is inhibited when the comparison result signal 118 is of high level. The searching point register output address counter 117 generates the address of the searching point register 15 which is the destination for the data transferred from the searching point information input latch 112. The address is incremented by "+1" when the comparison result signal 118 is of high level. Accordingly, in the case of the example illustrated in FIG. 3B, the searching points (0, 1), (1, 0), (1, 2), (0, 3) and (3, 4) are eliminated as the wiring obstacle points from the contents of the searching point register 15 before operation of the duplicate trace eliminating unit 18, i.e. from the searching points (0, 1), (1, 0), (1, 2), (1, 4), (0, 3), (1, 2), (5, 4), (4, 5) and (3, 4), as a result of which only the information of the searching points (1, 4), (5, 4) and (4, 5) are left in the searching point register 15 after the operation of the duplicate trace eliminating unit 18. At this juncture, it should be mentioned that a similar function as mentioned above can also be realized by affixing an invalid data flag to the relevant searching point data placed in the searching point register 15 and suppressing the transfer of the data to the wavefront memory 11 by the valid data selector 19, as will be described hereinafter, instead of eliminating and compressing the actual contents of the searching point register 15 as described above.

Figure 14:
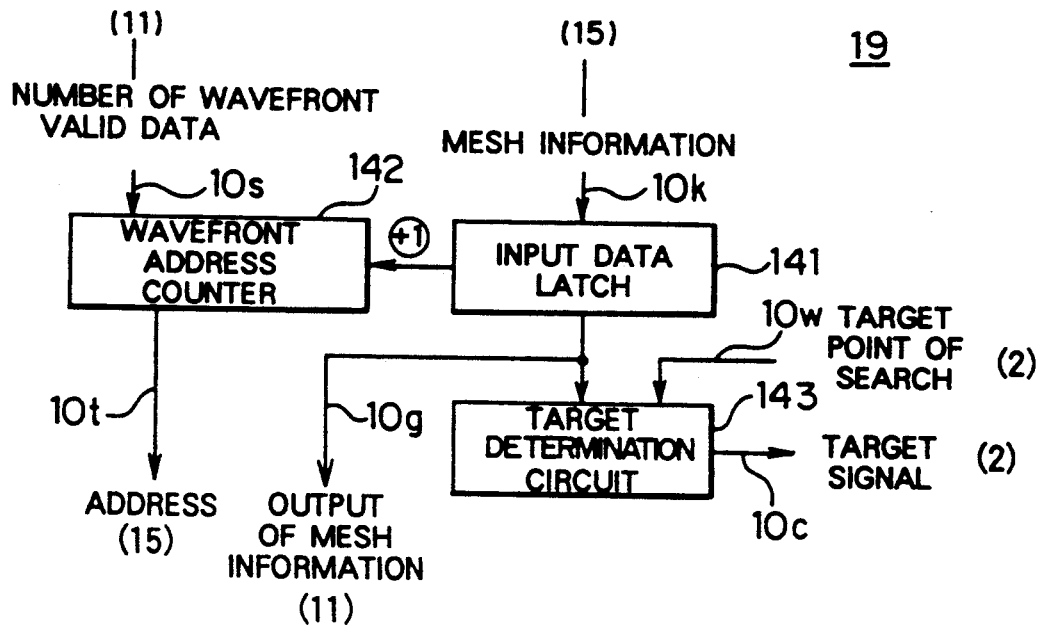
FIG. 14 is a block diagram showing a circuit configuration of a valid data selector.

FIG. 14 is a block diagram showing an exemplary structure of the valid data selector 19. In the figure, an input data latch 141 serves as a buffer for holding the data supplied from the searching point register 15. A wavefront address counter 142 outputs memory location information of the wavefront memory 11 in the form of the address information. The initial value of the wavefront address counter 142 corresponds to the value of the valid data counter 52 incorporated in the wavefront memory 11 and is counted up by a number corresponding to that of the valid data held in the searching point register 15 A target decision circuit 143 makes decision as to whether there exists a mesh point in the searching point data transferred from the valid data selector 19 which corresponds to a terminal to be connected by wiring. When the target terminal is detected, the target signal assumes a high level, whereupon the wire routing operation is stopped. A this juncture, it should be mentioned that the wavefront memory 11 may be partitioned in accordance with differences in the cost. In that case, the cost value contained in the searching point data may be made use of as a part of the address.

Next, description will be directed to a control procedure executed by the processing unit 2 (FIG. 1) for the individual units described above. At first, information concerning the wiring inhibit meshes (obstacle mesh points) is loaded in the mesh memory 17, while the wavefront memory 11 is loaded with information concerning the search starting point for the terminal to be wired with the cost for the starting point being placed in the cost counter 63. After having initialized the wire routing apparatus in this manner processing procedure described below is repetitively executed until the content of the wavefront memory becomes "0" with the failure signal 10b assuming a high level or until the wiring path as searched has reached a target point with the target signal 10c becoming high. Control of the repetitive operations is illustrated in the flow chart of FIG. 2. More specifically, during a period in which the searching point information is transferred from the wavefront memory 11 to the searching point register 15, the neighbor address calculating unit 13 and the cost calculating unit 14 are activated. Subsequently, the searching point information is written in the mesh memory 17 from the searching point register 15 via the searching point write-out circuit 16, whereon the valid data is selected by the duplicate trace eliminating unit 18. During the data transfer from the searching point register 15 to the wavefront memory 11, the searching point information is stored in the wavefront memory 11 sequentially in the order of the costs values through the valid data selector 19.

Figure 16:
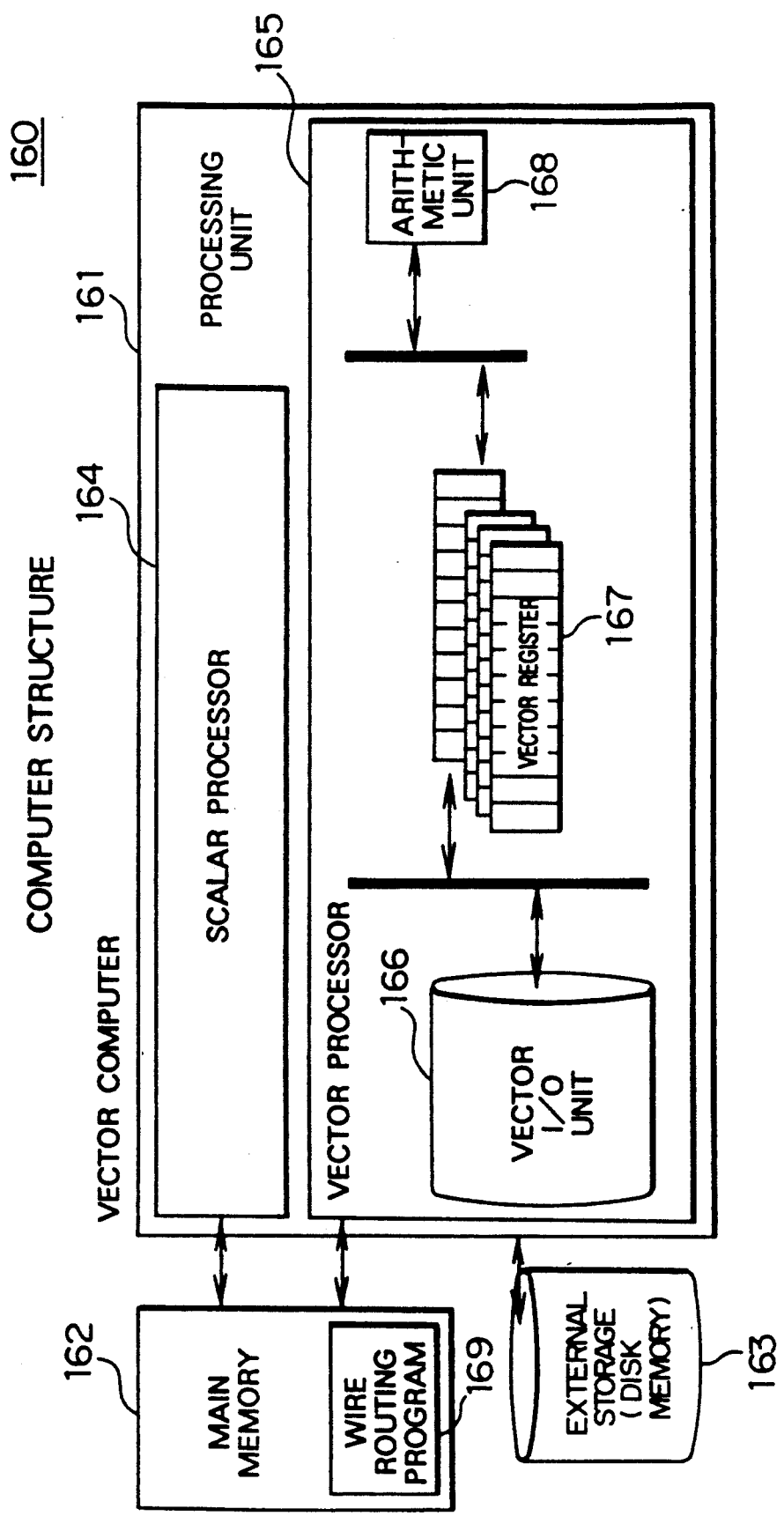
FIG. 16 is a diagram showing an arrangement of a computer for carrying out another embodiment of the invention.

In the foregoing, an embodiment of the invention implemented by hardware in the configuration shown in FIG. 1 has been described. It should however be appreciated that the aimed object of the invention can equally be achieved in software by using a vector computer such as shown in FIG. 16. In the following, description will be made of an embodiment of the invention which can be implemented by software.

The vector computer shown in FIG. 16 and denoted generally by 160 is composed of a processing unit 161 which includes a scalar processor 164 and a vector processor 165, a main memory 162 and a disk memory device 163. In more detail, the vector processor 165 includes a vector I/O unit 166, a vector register 167 and an arithmetic unit 168 and is adapted to perform pipeline processing on array data stored in the vector register 167. The main memory 162 stores a wire routing program 169 for carrying out the invention, which program is executed by the vector processor 165.

Figure 15A:
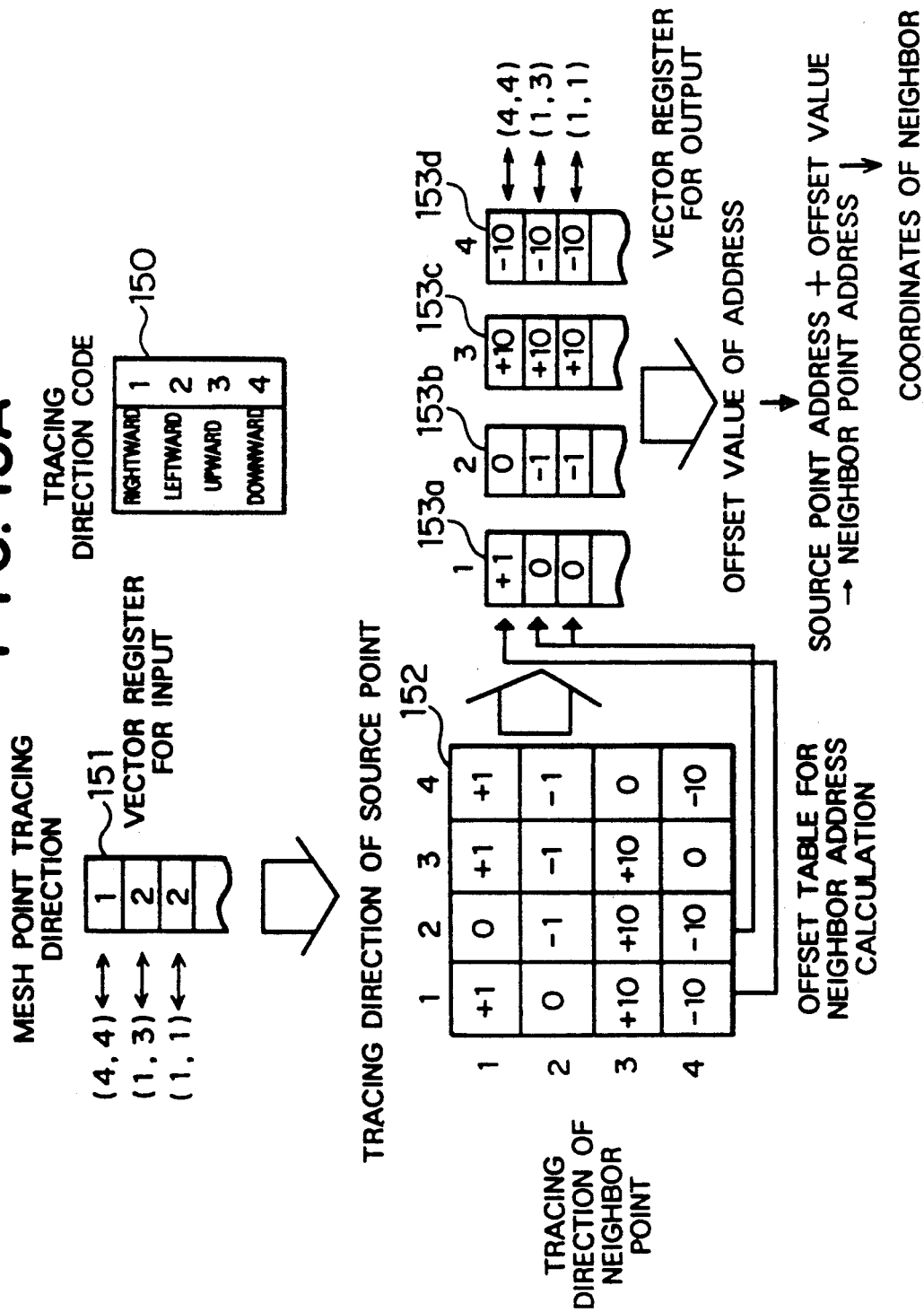
FIGS. 15A and 15B are flow charts for illustrating addresses calculation procedures executed by using a vector computer according to another embodiment of the invention.

Data corresponding to those stored in the wavefront memory 11 and the searching point register 15 shown in FIG. 1 are assigned to the vector register 167 from the disk memory device 163 through the vector I/O unit 166. The processings corresponding to operations of the expansion point extracting unit 12, the neighbor address calculating unit 13, the cost calculating unit 14, the searching point write-out unit 16, the duplicate trace eliminating unit 18 and the valid data selector 19 are executed by the arithmetic unit 168 under the control of software. Among others, the processings which correspond to the operations of the neighbor address calculating unit 13 and the cost calculating unit 14 can be realized at a high speed by making use of a list vector function of the vector computer 160 shown in FIG. 15. Both of these processings (i.e. calculations of the neighbor address and the cost) feature the operation of outputting values prepared previously on the basis of input data. FIG. 15A is a flow chart illustrating a procedure for calculating the neighbor addresses by using the vector register 167. For the neighbor address calculation, information concerning the tracing directions is stored in an input vector register 151 in a number corresponding to that of the mesh points to be traced. A neighbor address calculating offset table 152 stored in the main memory 162 is referred to by using as list vectors the data stored in the input vector register 151 to thereby output the address offset values corresponding to the mesh tracing directions to the output vector register 153a to 153d, respectively. In the case of the three-dimensional routing, these registers have to be provided in a number sufficient for affording the tracing in the six directions. In the case of the example illustrated in FIG. 15A, however, the registers are provided in a number corresponding to four directions on the assumption that a two-dimensional wire routing is a matter of concern. Details of the neighbor address calculation illustrated in FIG. 15A and the cost calculation illustrated in FIG. 15B will be described later on.

Figure 17:
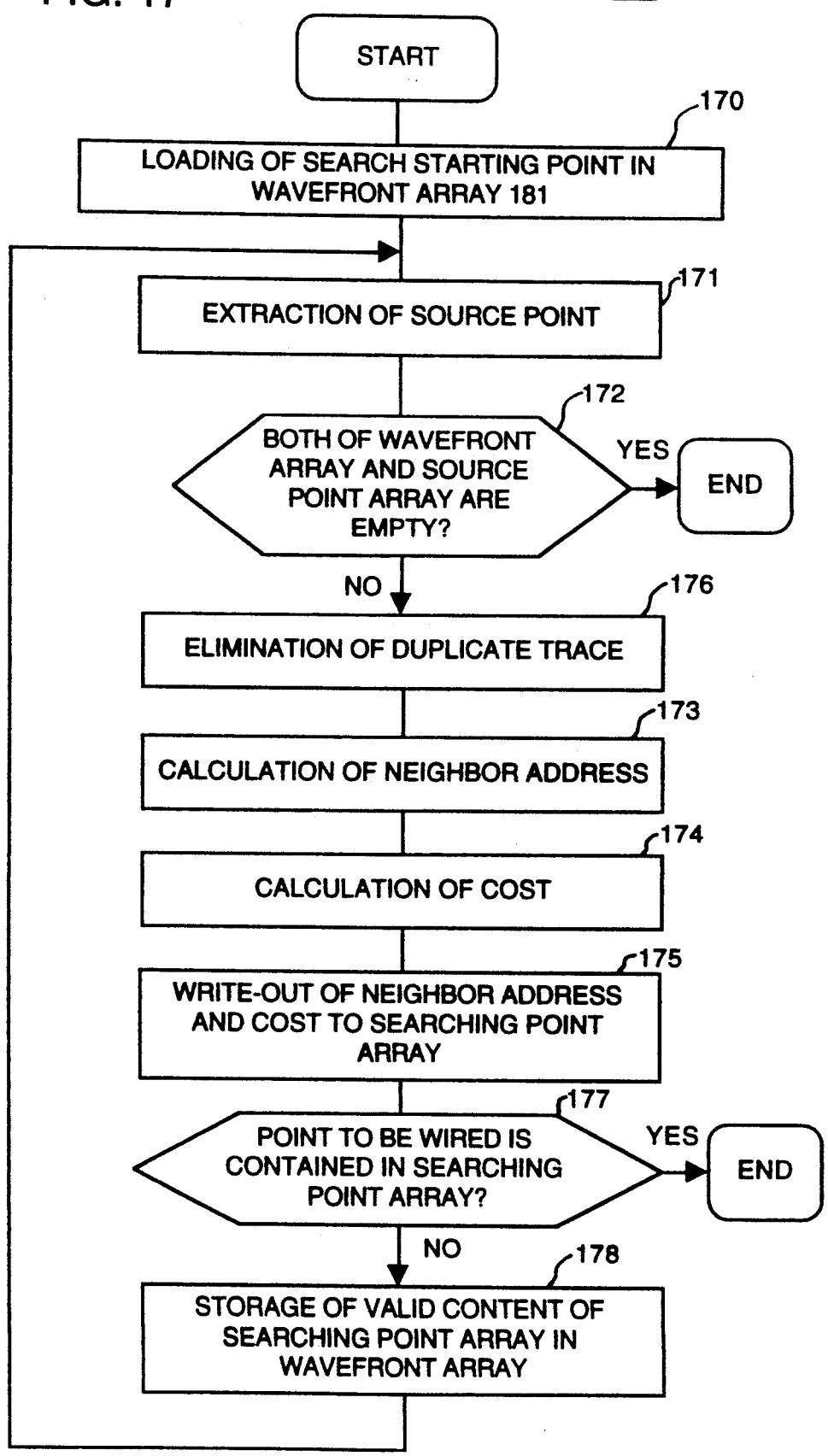
FIG. 17 is a flow chart for illustrating a wire routing procedure executed by the vector computer.
Figure 18:
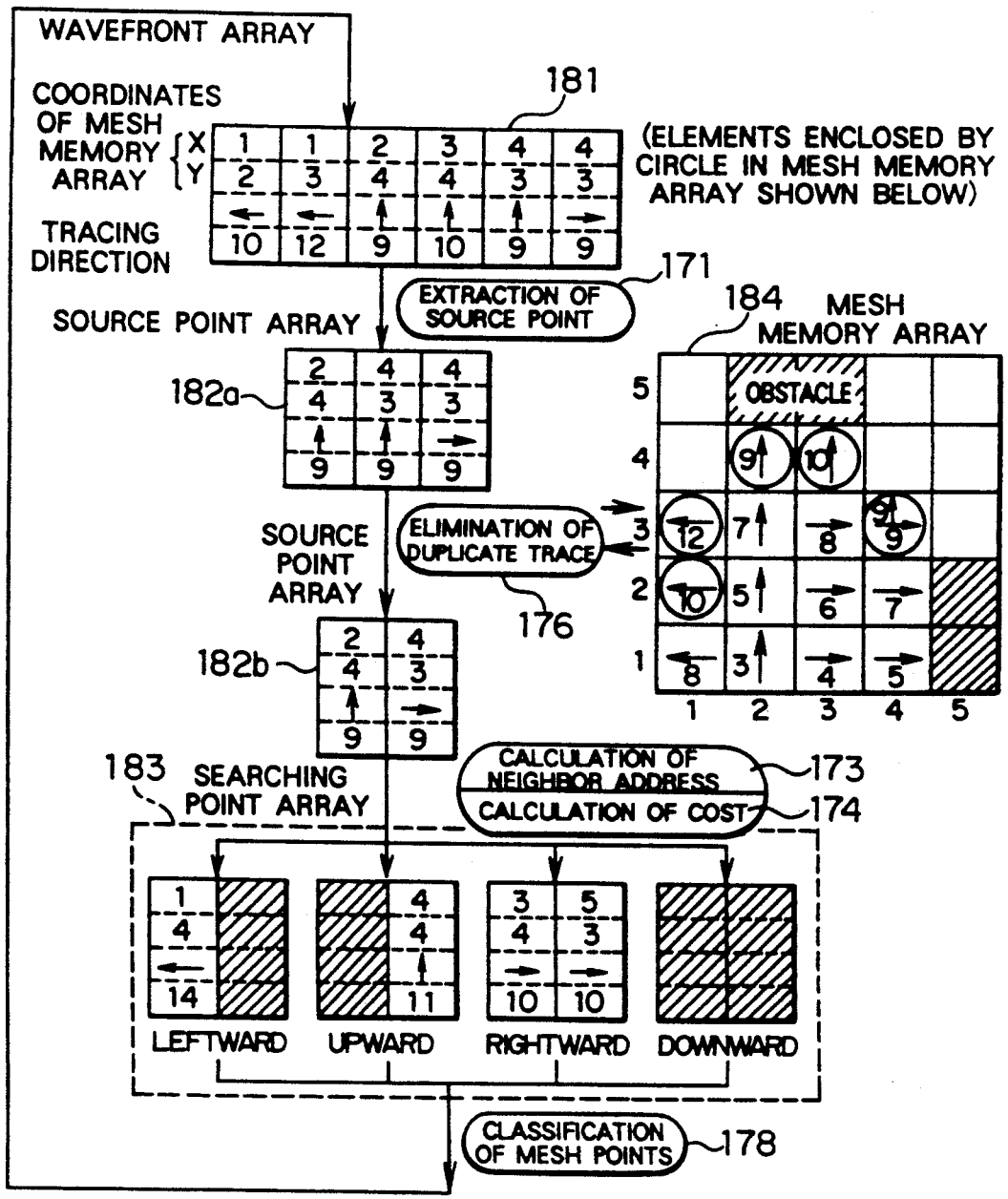
FIG. 18 is a flow chart for illustrating data flow during the wiring path searching process.

Description will now be turned to the embodiment of the invention realized softwarewise by using the vector computer 160 by referring to a flow chart of FIG. 17 and a data flow chart of FIG. 18. As data sources required for the wire routing processing according to the instant embodiment, there are provided a wavefront array 181, an expansion source array 182, a searching point array 183 and a mesh memory array 184, as shown in FIG. 18, all of which are realized as array structures in a program and stored in the main memory 162. The content of the searching point array 183 inter alia is loaded in the vector register 167 to be processed at a high speed by making use of the list vector function of the vector computer 160. The wavefront array 181, the searching point array 183 and the mesh memory array 184 correspond to the wavefront memory 11, the searching point register 15 and the mesh memory 17 shown in FIG. 1, respectively.

The wavefront array 181 contains data for managing the information of the mesh point located at the boundary of the mesh for which the path search processing has been completed and includes the information of the mesh memory array address (coordinates), the tracing direction and the cost. Information of the mesh point having the least cost in the wavefront array 181 is copied to the expansion source array 182. The searching point array 183 stores the information of the neighbor mesh points for each of the mesh points in the expansion source array 182. Stored in the mesh memory array 184 at each element thereof are the tracing direction, the routing cost and the obstacle information for each mesh point.

Description will now be made of the wire routing procedure by reference to the flow chart of FIG. 17. At first, the information concerning the search starting point, i.e. the initial values of address, tracing direction and the cost of the starting point contained in the mesh memory array 184 are registered in the wavefront array 181 (step 170 in FIG. 17). The subsequent processing is repetitively executed until the number of elements in the wavefront array 181 becomes zero or until the mesh point to be connected is detected. In an expansion source extracting step 171, information of the mesh point from which the searching is started (i.e. information of the starting point) is copied to the expansion source array 182. At that time, when the element numbers of both the wavefront array 181 and the expansion source array 182 are zero, this means that the wiring path could not be found, whereupon the search processing is terminated (step 172).

Figure 19:
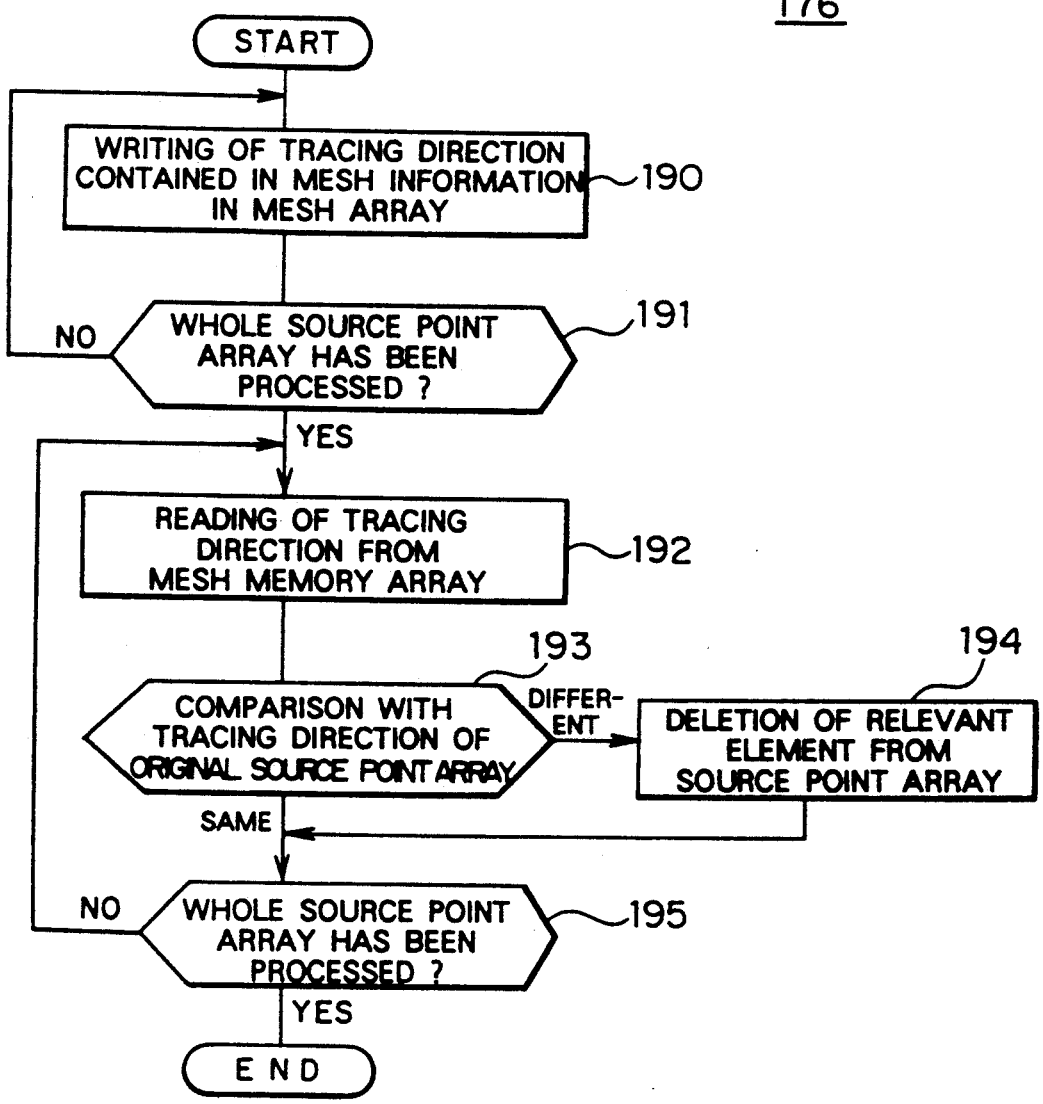
FIG. 19 is a flow chart for illustrating a duplicate trace elimination procedure according to another embodiment of the invention.

There may occur a situation in which one and the same element in the mesh memory array 184 exists in the expansion source array 182 in duplicate. In that case, a duplicate trace elimination processing 1786 is executed for eliminating the element existing in duplicate. FIG. 19 is a flow chart for illustrating the duplicate trace elimination processing. Referring to this figure, all the tracing directions stored in the expansion source array 182a shown in FIG. 18 are written in the mesh memory array 184 (steps 190, 191). Next, the tracing direction written previously is read out from the element in the mesh memory array 184 which corresponds to the mesh point stored in the expansion source array 182a (step 192) and compared with the information of the tracing direction held in the expansion source array 182a (step 193). When the comparison results in discrepancy between both tracing directions, this indicates that overwrite occurs in writing the tracing direction in the mesh memory array 184. Accordingly, the element in the expansion source array 182a for which the discrepancy in the tracing direction has been found from the abovementioned comparison is deleted as the invalid element (step 194). The processing steps 192 to 194 are iterated for all the elements in the expansion source array 182a (step 195), respectively. Thereafter, in a neighbor address calculation step 173 and a cost calculation step 174, the addresses and the costs are calculated for the mesh points located adjacent to each element of the expansion source array 182b which has undergone the duplicate trace elimination processing in the step 176.

Next, details of the address calculation step 173 for the neighbor mesh points will be described by reference to FIG. 15A. Stored in the input vector register 151 are codes representing the tracing directions for the mesh points which correspond to the elements (4, 4), (1, 3) and (1, 1) of the mesh memory 17 shown in FIG. 3B. Correspondence relations between the tracing directions and the codes are shown in a table 150. By using the three mesh points mentioned above as the expansion sources, offset values corresponding to the respective tracing direction codes are read out from an offset table 152 provided for the neighbor address calculation. In the offset table 152, there are arrayed offset values of the addresses of four neighbor mesh points in each of the tracing directions of the expansion source. Intrinsically, the offset value of the neighbor mesh should be independent of the tracing direction of the expansion source. However, in the case of the instant embodiment, an offset value of "0" is assigned to the elements of the table 152 which are involved in the tracing for the purpose of excluding such useless tracing in which the tracing direction of the expansion source and that of the neighbor mesh are opposite to each other. Since the situation in which the useless tracing mentioned above occurs varies in dependence on the tracing directions of the expansion source, the table 152 is implemented in the form of a two-dimensional array. The offset values extracted from the table 152 are stored in the output vector registers 153a to 153d provided for the different tracing directions, respectively. By adding together the address of the expansion source and the offset values stored in the output vector registers 153a to 153d, respectively, there can be obtained the addresses of the neighbor mesh points. Further, the coordinates of the neighbor mesh points can be derived from the respective addresses in accordance with the expression (2) mentioned hereinbefore. The vector processor 165 fetches successively the tracing direction codes of the expansion sources from the vector register 167 to execute repetitively the processing described above.

Figure 15B:
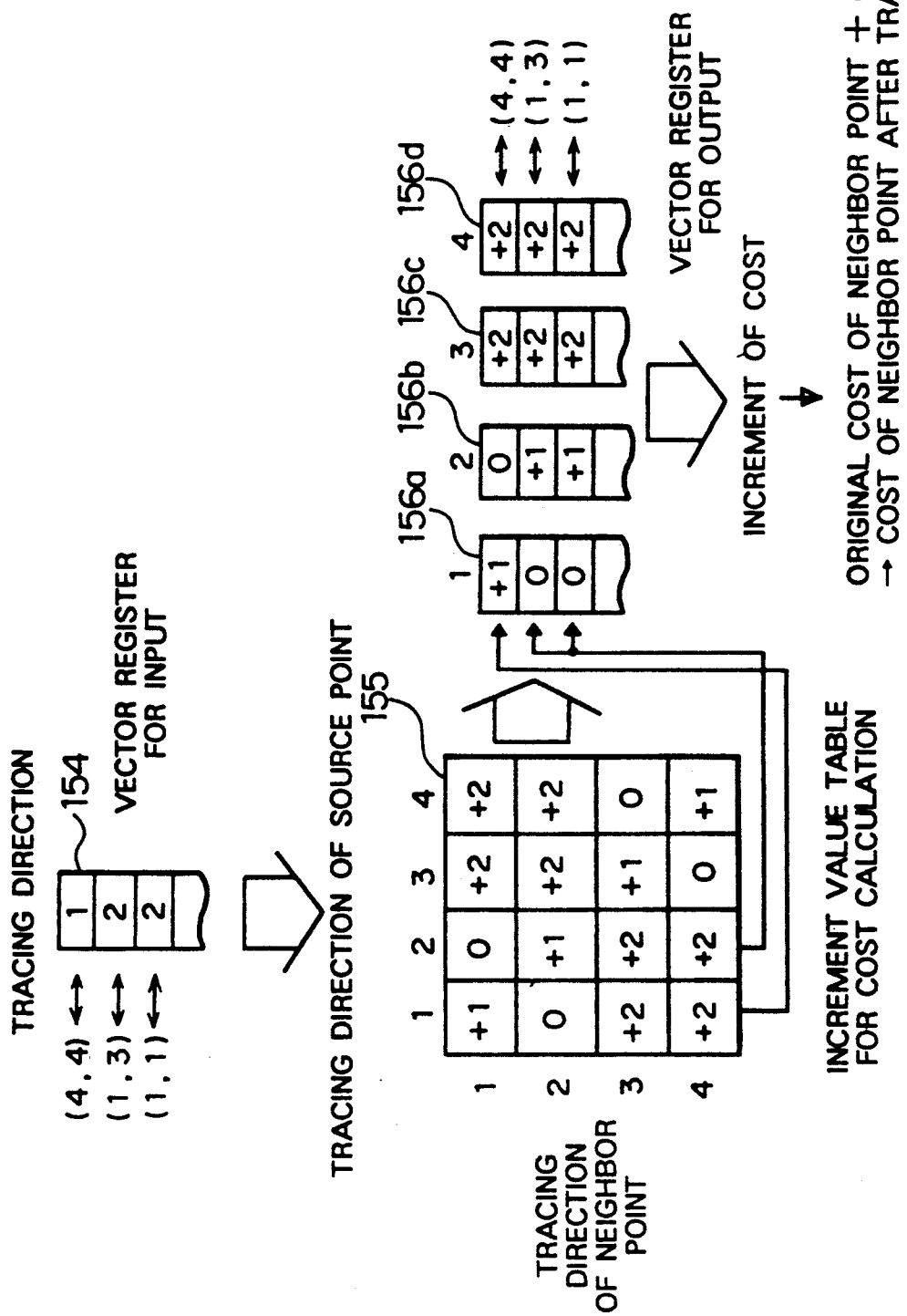

Next, description will be turned of details of the cost calculation 174 for the neighbor mesh points by reference to FIG. 15B. The tracing direction codes stored in the input vector register 154 are the same as those shown in FIG. 15A. By setting the three mesh points mentioned previously as the expansion sources, increments in the cost corresponding to these tracing direction codes, respectively, are read out from the increment value table 155 for the cost calculation. The table 155 is structured in a two-dimensional array similarly to the table 152 shown in FIG. 15A. Stored in each element of the table 155 are increment values in the cost for the four neighbor meshes in each of the tracing directions from the expansion source. More specifically, an increment value of "+1" is stored when the tracing direction of the expansion source point is the same as that of the neighbor mesh point, while an increment value of "+2" is stored when the tracing direction of the expansion source point differs from that of the neighbor mesh point and unless these tracing directions are opposite to each other. An increment value of "0" is stored when the tracing directions are in opposition to each other. According to the instant embodiment of the invention, when there occurs the useless searching in which the tracing direction of the expansion source point and that of the neighbor mesh point are opposite to each other, the cost increment value of "0" is set for the element in the table 155 corresponding to the useless search in the neighbor address calculation step 173. The cost increment values read out from the table 155 are stored in the output vector registers 156a to 156d provided in correspondence to the tracing directions, respectively. By adding the cost increment values loaded in the output vector registers 156a to 156d to the cost value of the expansion source point, there can be obtained the cost values for the neighbor mesh points after the tracing thereof. The vector processor 165 fetches successively the tracing direction codes for each expansion point from the vector register 157, whereon the processing described above is iterated.

The results of the calculation mentioned above are written in the searching point array 183 (step 175). Since the elements stored in the searching point array 183 correspond to the mesh points forming a new or updated wavefront in the maze routing algorithm, decision is then made as to whether or not any counterpart mesh point to be connected by the wiring is contained in the wavefront by checking the individual elements placed in the searching point array 183. In case the counterpart mesh point to be wired is contained in the searching point array 183, this means that the wiring path has been discovered, whereupon the wire routing processing comes to an end. On the other hand, unless the counter-part mesh point to be wired is found or there exists another mesh point to be wired, the content of the searching point array 183 is transferred to the wavefront array 181 through the valid data selecting processing 178. In that case, if any unusable mesh points due to the wiring obstacle or for any other reasons are contained in the searching point array 183, these unusable mesh points are deleted in precedence to the data transfer to the wavefront array 181.

Now, data flow in the routing processing will be described in conjunction with an exemplary data structure shown in FIG. 18 on the assumption that the routing has reached the state described in the mesh memory array 184. In this mesh memory array 184, arrows represent the tracing directions and numerals indicate the costs. At this time point, the wavefront is formed by the mesh points (1, 2), (1, 3), (2, 4), (3, 4), (4, 3) and (4, 3), and the information of the mesh points corresponding to the elements each enclosed by a circle in the mesh memory array 184 is stored in the wavefront array 181. Through the expansion point extraction processing 171, information of the mesh points (2, 4), (4, 3) and (4, 3) having the minimum cost value "0" is stored in the expansion source array 182a. Subsequently, through the duplicate trace elimination processing 176, one of two data for the identical elements (4, 3) of the mesh memory array 184 which has first been stored, i.e. the information of the updirection (↑) is deleted, whereby an updated expansion source array 182b is obtained. Next, position (neighbor address) calculation 173 and cost calculation 174 are executed for the mesh points located adjacent to those placed in the expansion source array 182b, whereon the results of the calculation as well as the tracing directions are placed in the searching point array 183. In the case of the example illustrated in FIG. 18, these data are stored as classified in accordance with the upward, downward, leftward and rightward tracing directions, respectively. More specifically, data of the mesh points (1, 4) and (3, 4) are placed in the searching point array 188 as the neighbor point data for the expansion point (2, 4). Finally, decision is made as to whether or not the mesh point corresponding to the terminal which is to be connected by wiring is included in the neighbor mesh points placed in the searching point array 183 (step 177). When no relevant mesh point is found or when there exists another terminal which is to be wired from the same starting point, data stored in the searching point array 183 is loaded in the wavefront array 181, whereon the processing described above is iterated. When the relevant mesh point found in the searching point array 183, the wiring path search processing comes to an end.

In the wire routing apparatus according to the present invention in which only the data (wavefront) required for the wiring path searching is extracted to execute simultaneously the search processings in different tracing directions, memory capacity required for the wiring path searching can be reduced with a high speed being assured for the processing. In the wire routing method carried out by using the vector computer, the pipelined processing can be performed by using the vector register, which allows a high-speed processing to be executed even when the number of the mesh points subjected to the processing increases as the tracing proceeds. Besides, the time required for the processing of a single mesh point can be shortened as the vector length corresponding to the number of the mesh points increases.

We claim:

1. A wire routing apparatus for searching a wiring path in an integrated circuit on the basis of information concerning an area of said integrated circuit through which a wire can extend and information concerning terminals to be wired together, comprising:

first storage means for holding first searching point information inclusive of wire passage flags indicating permissibility of passing of the wire through mesh points in a routing area of said integrated circuit which is partitioned in a mesh-like pattern, search-done flags indicating that search has already been performed and tracing directions;

second storage means for holding second searching point information inclusive of addresses of said first storage means for first searching point, tracing directions and costs involved in wire routing;

expansion point extracting means for selecting from said first mesh points a second mesh point which constitutes a source point for a succeeding search on the basis of the costs in said second searching point information;

neighbor address calculating means for calculating addresses of said first storage means for third mesh points neighboring said second mesh point;

cost calculating means for arithmetically determining costs for said third mesh points on the basis of said second searching point information concerning said second mesh point and said second searching point information concerning said third mesh points;

third storage means for holding said second searching point information concerning said third mesh points as obtained through said neighbor address calculating means and said cost calculating means;

searching point write-out means for reading out content of said first storage means indicated by said second searching point information stored in said third storage means to make a determination as to whether or not said third mesh points can be searched and write out content of said third storage means to said first storage means when said third mesh points can be searched;

duplicate trace eliminating means for comparing content of said first storage means indicated by said second searching point information stored in said third storage means with content of said third storage means to thereby eliminate from said third storage means the second searching point information having the content in duplicate with that of said first storage means;

valid data selecting means for determining whether or not a mesh point corresponding to the terminal to be wired is included in the content of said third storage means and writing out the content of said third storage means to said second storage means unless the mesh point corresponding to the terminal to be wired is contained; and control means for designating a starting point and a target point for the searching which correspond to two terminals to be wired to said second storage means and said valid data selecting means.

2. A wire routing apparatus according to claim 1, wherein said neighbor address calculating means assigns one-dimensionally addresses to memory units of said first storage means and calculates the addresses of said first storage means corresponding to said third mesh points as increment values of address of said second mesh point.

3. A wire routing apparatus according to claim 1, wherein said cost calculating means calculates increment of the cost of said third mesh points on the basis of tracing directions of said second mesh point and said third mesh points.

4. A wire routing apparatus according to claim 1, wherein said expansion point extracting means selects the mesh point for which the cost is lowest from said second storage means.

5. A wire routing apparatus according to claim 1, wherein when a plurality of mesh points corresponding to a plurality of terminals to be wired are included in the content of said third storage means, said valid data selecting means writes out the content of said third storage means to said second storage means until search processing for said plural terminals to be wired has been completed.

6. A wire routing method carried out by a vector computer including a plurality of vector registers, a pipeline arithmetic unit and a main memory, comprising steps of:

a) holding in a mesh memory array of said main memory first searching point information inclusive of wire passage flags indicating permissibility of passing of a wire through mesh points in a routing area divided in a mesh-like pattern, a search-over flag indicating that search has already been performed and tracing direction;

b) holding in a wavefront array second searching point information inclusive of addresses of said first storage means for first mesh points constituting leading ones of mesh point arrays, the tracing direction and costs involved in wire routing;

c) selecting from said first mesh points a second mesh point which constitutes a source point for a succeeding search on the basis of said cost information;

d) calculating addresses of said first storage means for third mesh points neighboring said second mesh point;

e) calculating costs for said third mesh points on the basis of said second searching point information concerning said second mesh point and said second searching point information concerning said third mesh points;

f) holding in a searching point array said second searching point information concerning said third mesh points as obtained in said steps d) and e);

g) reading out content of said mesh memory array indicated by said second searching point information stored in said searching point array to make a determination as to whether or not said third mesh points can be searched and write out content of said searching point array to said mesh memory array when said third mesh points can be searched;

h) comparing content of said mesh memory array indicated by said second searching point information stored in said searching point array with content of said searching point array to thereby eliminate from said searching point array the second searching point information having the content duplicative with that of said mesh memory array;

i) determining whether or not a mesh point corresponding to a terminal to be wired is included in the content of said searching point array and writing out the content of said searching point array to said wavefront array unless the mesh point corresponding to the terminal to be wired is contained; and j) repeating said steps a) to i) by designating newly a starting point and a target point for the searching which correspond to two terminals to be wired, respectively.

* * * * *